US012604454B2

(12) United States Patent
Sumi et al.

(10) Patent No.: US 12,604,454 B2
(45) Date of Patent: Apr. 14, 2026

(54) MEMORY DEVICE

(71) Applicant: Kioxia Corporation, Tokyo (JP)

(72) Inventors: Reiko Sumi, Tokyo (JP); Takashi Inukai, Kanagawa (JP); Tsuneo Inaba, Kanagawa (JP); Takayuki Miyazaki, Tokyo (JP)

(73) Assignee: Kioxia Corporation, Tokyo (JP)

( * ) Notice: Subject to any disclaimer, the term of this patent is extended or adjusted under 35 U.S.C. 154(b) by 212 days.

(21) Appl. No.: 18/601,832

(22) Filed: Mar. 11, 2024

(65) Prior Publication Data

US 2024/0324169 A1    Sep. 26, 2024

(30) Foreign Application Priority Data

Mar. 20, 2023    (JP) ................................. 2023-044215

(51) Int. Cl.
| | |
|---|---|
| *G11C 16/04* | (2006.01) |
| *H01L 23/482* | (2006.01) |
| *H01L 23/538* | (2006.01) |
| *H10B 12/00* | (2023.01) |

(52) U.S. Cl.
CPC ..... *H10B 12/0335* (2023.02); *H01L 23/4824* (2013.01); *H01L 23/538* (2013.01); *H10B 12/485* (2023.02); *H10B 12/488* (2023.02)

(58) Field of Classification Search
CPC ......................... H10B 12/0335; H10B 12/485; H10B 12/488; H10B 23/4824; H10B 23/538
See application file for complete search history.

(56) References Cited

U.S. PATENT DOCUMENTS

| | | | |
|---|---|---|---|
| 11,024,385 B2 | 6/2021 | Chibvongodze et al. | |
| 11,282,568 B2 | 3/2022 | Maejima | |
| 2012/0307545 A1 | 12/2012 | Mcadams et al. | |
| 2019/0130987 A1* | 5/2019 | Choi ................... | G11C 11/4094 |
| 2022/0020736 A1 | 1/2022 | Yip et al. | |
| 2022/0319575 A1* | 10/2022 | Lee ...................... | G11C 11/4097 |
| 2022/0383939 A1* | 12/2022 | Kolar ........................ | G11C 7/18 |

* cited by examiner

*Primary Examiner* — Pho M Luu
(74) *Attorney, Agent, or Firm* — Foley & Lardner LLP

(57) ABSTRACT

A memory device includes, a memory cell array including first to fourth sub-arrays, a first bit line coupled to the first sub-array and the second sub-array, a second bit line arranged side by side with the first bit line in a first direction and coupled to the third sub-array and the fourth sub-array, a third bit line arranged at a position different from the first bit line in a second direction and coupled to at least the second sub-array and the third sub-array, a fourth bit line arranged side by side with the third bit line in the first direction and coupled to the fourth sub-array, a first circuit electrically coupled to the first bit line and the second bit line, and a second circuit electrically coupled to the third bit line and the fourth bit line.

18 Claims, 28 Drawing Sheets

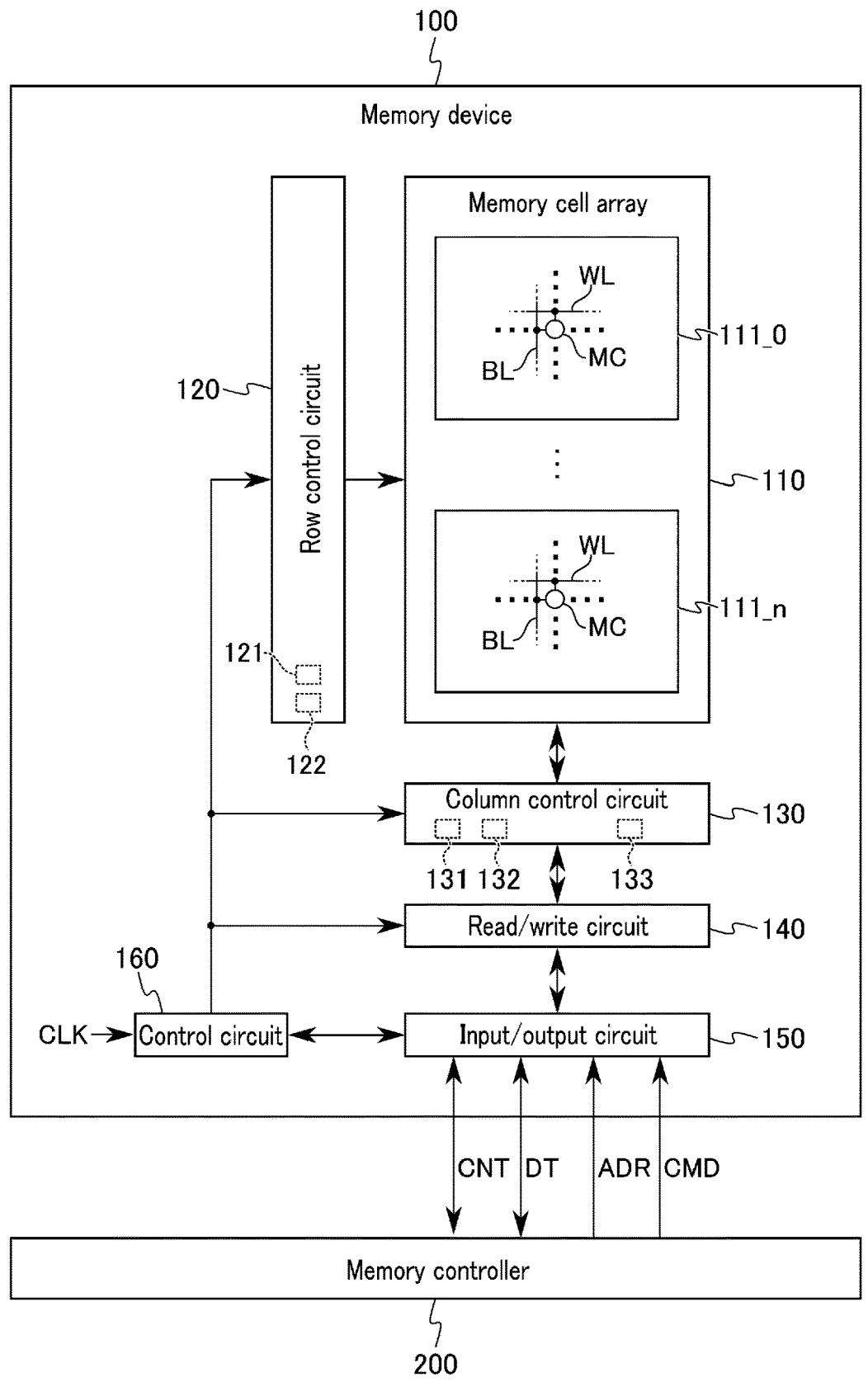
F I G. 1

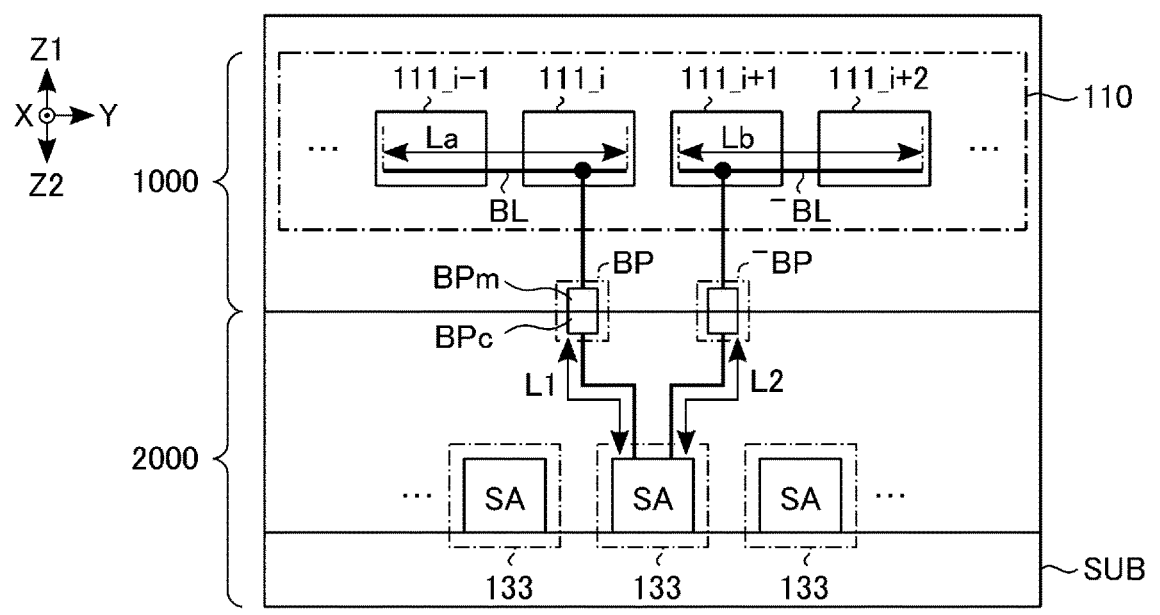
F I G. 2
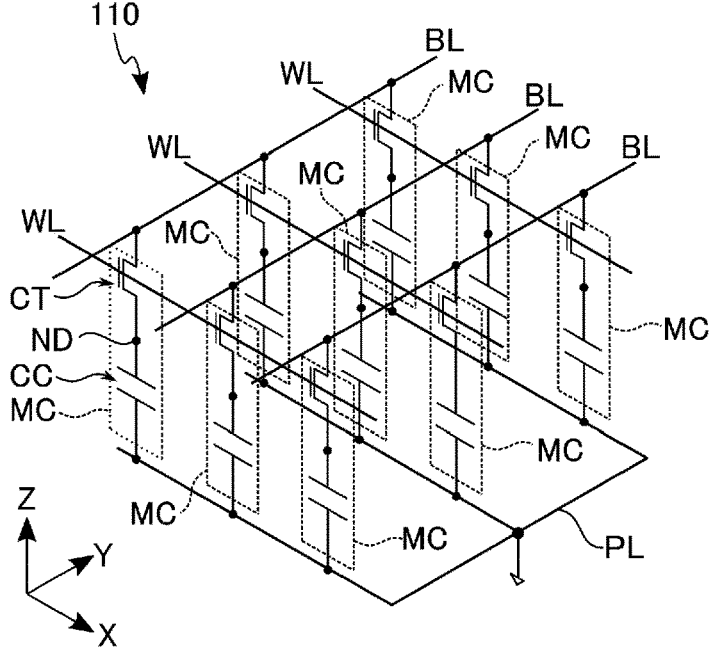
F I G. 3

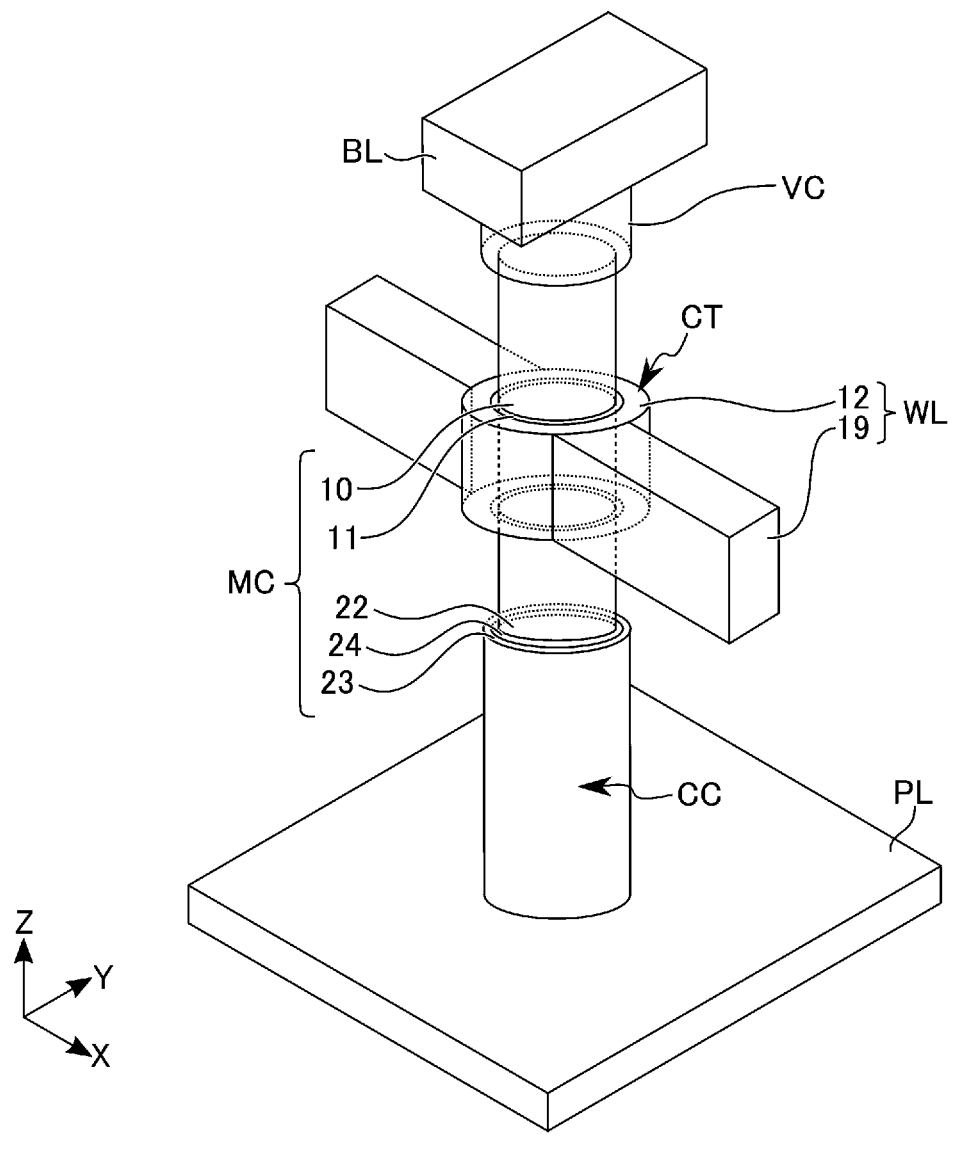
F I G. 4

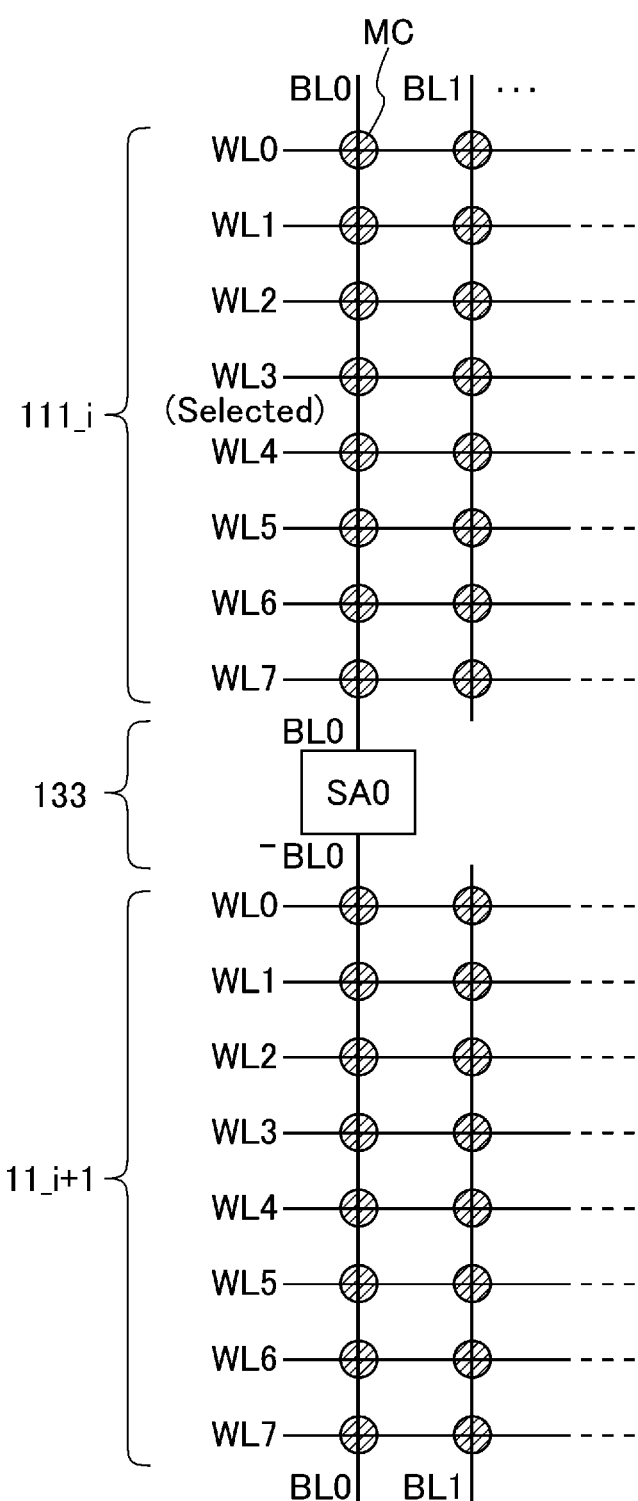
F I G. 5

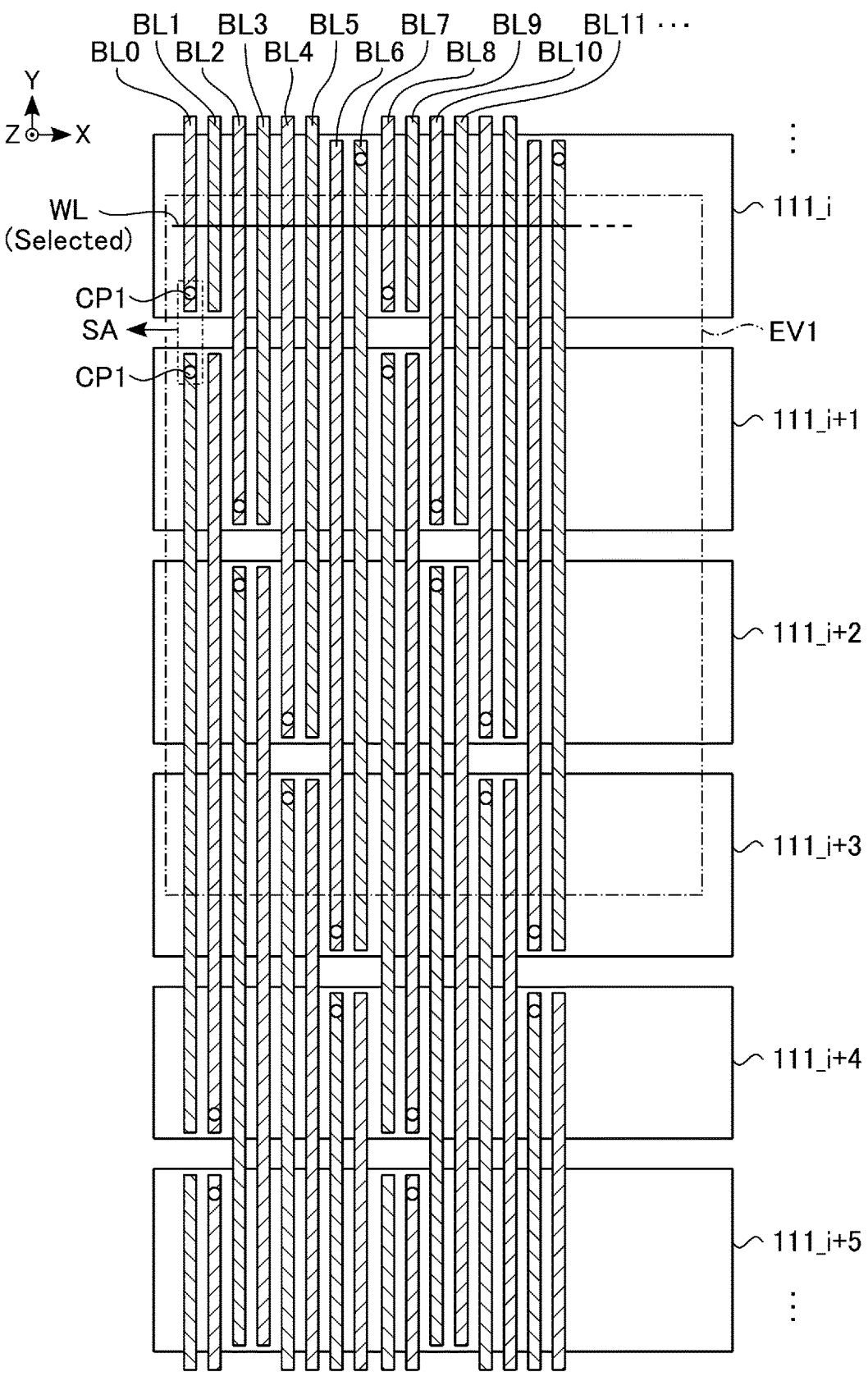
F I G. 7

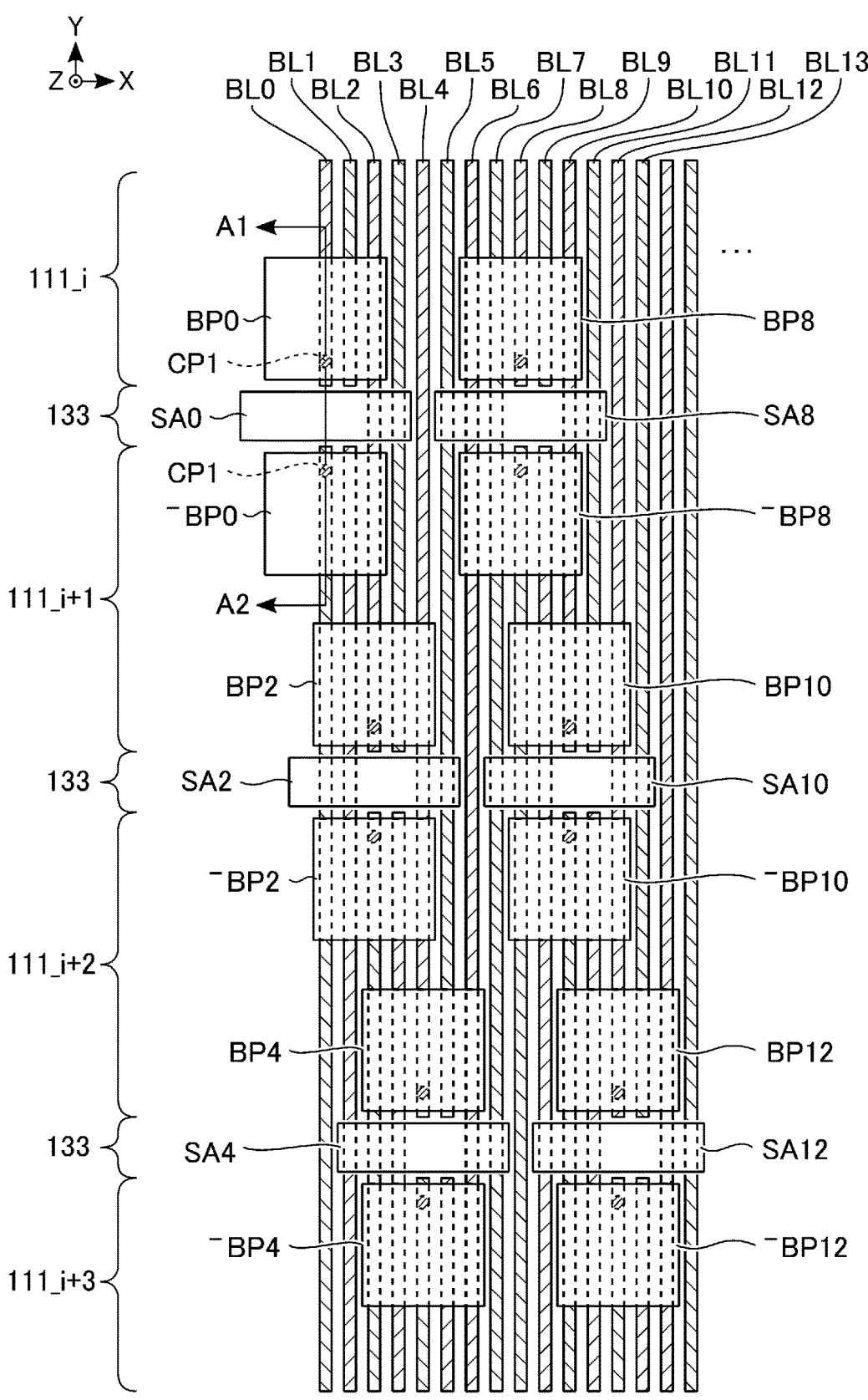
F I G. 8

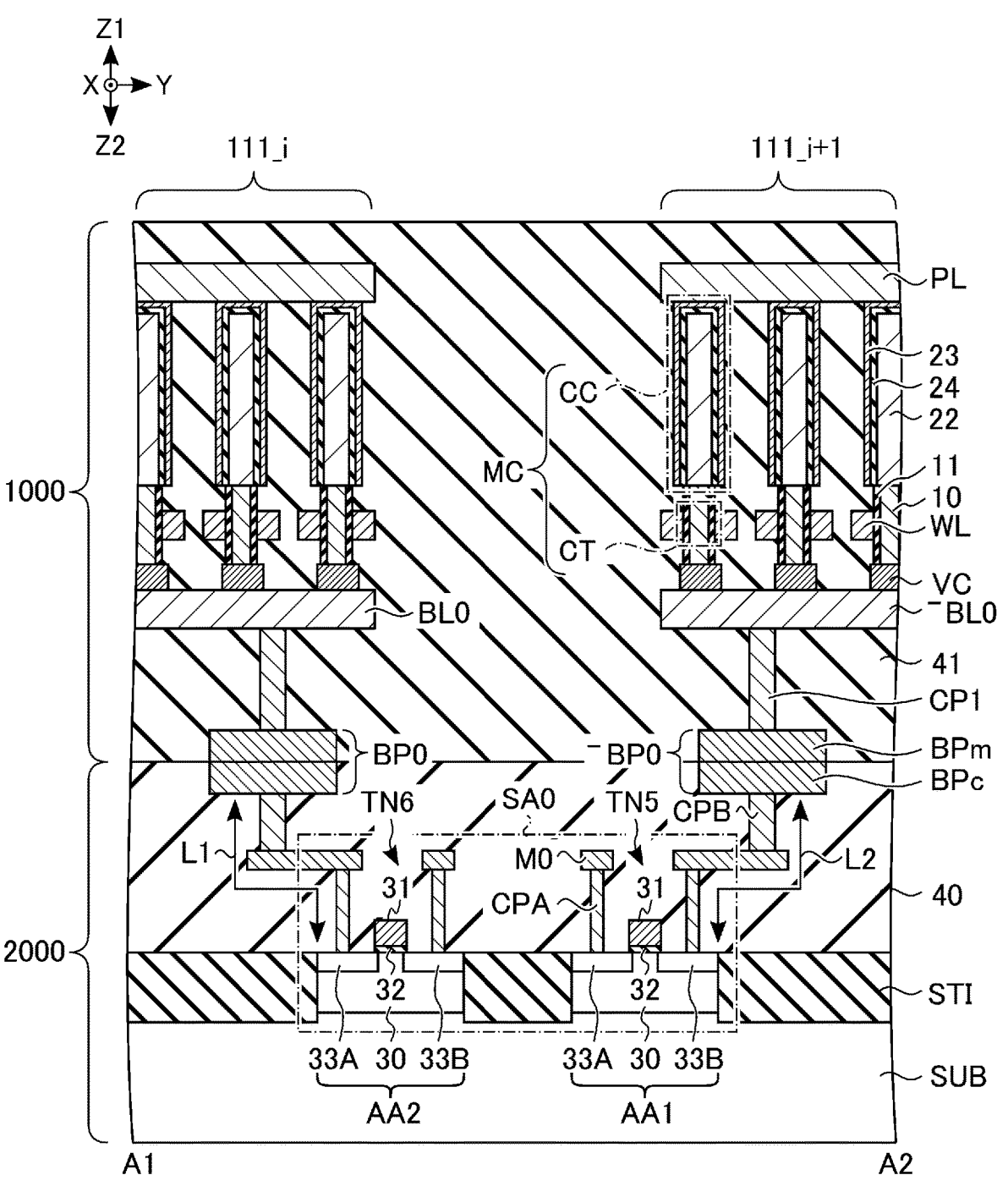
F I G. 9

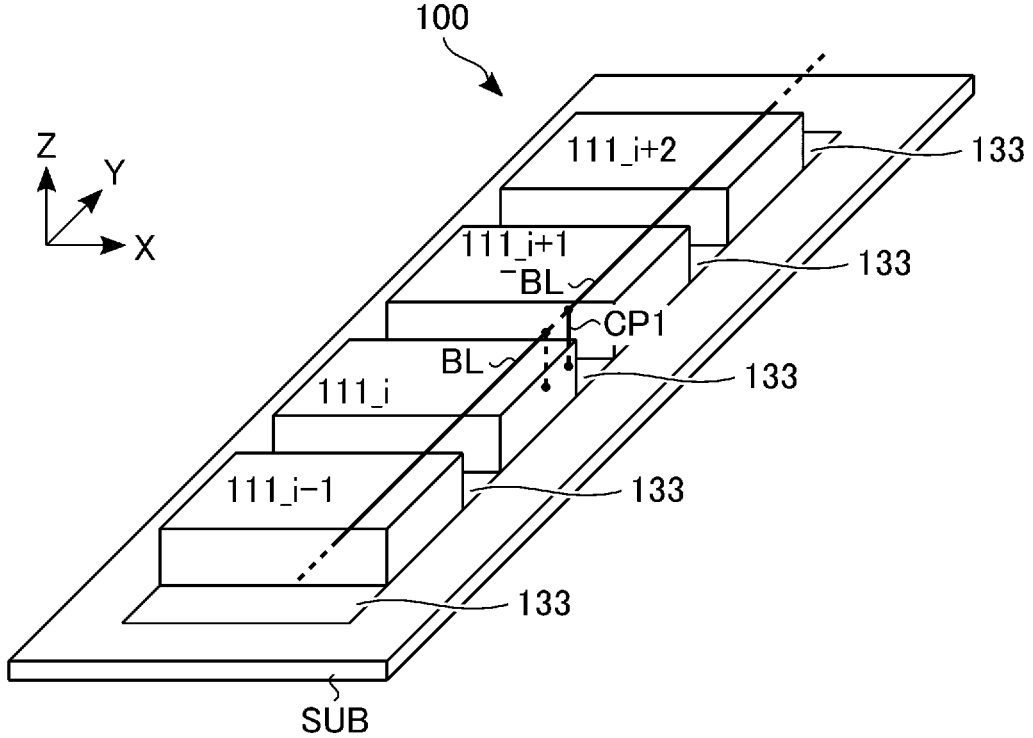
F I G. 10

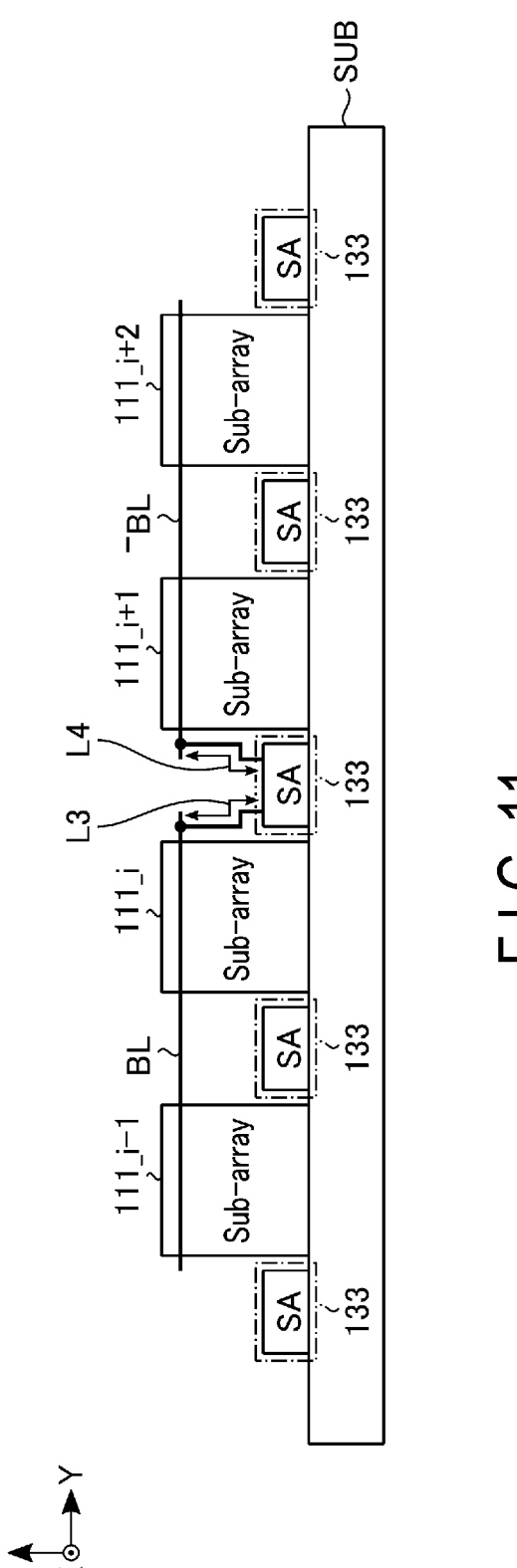
F I G. 11

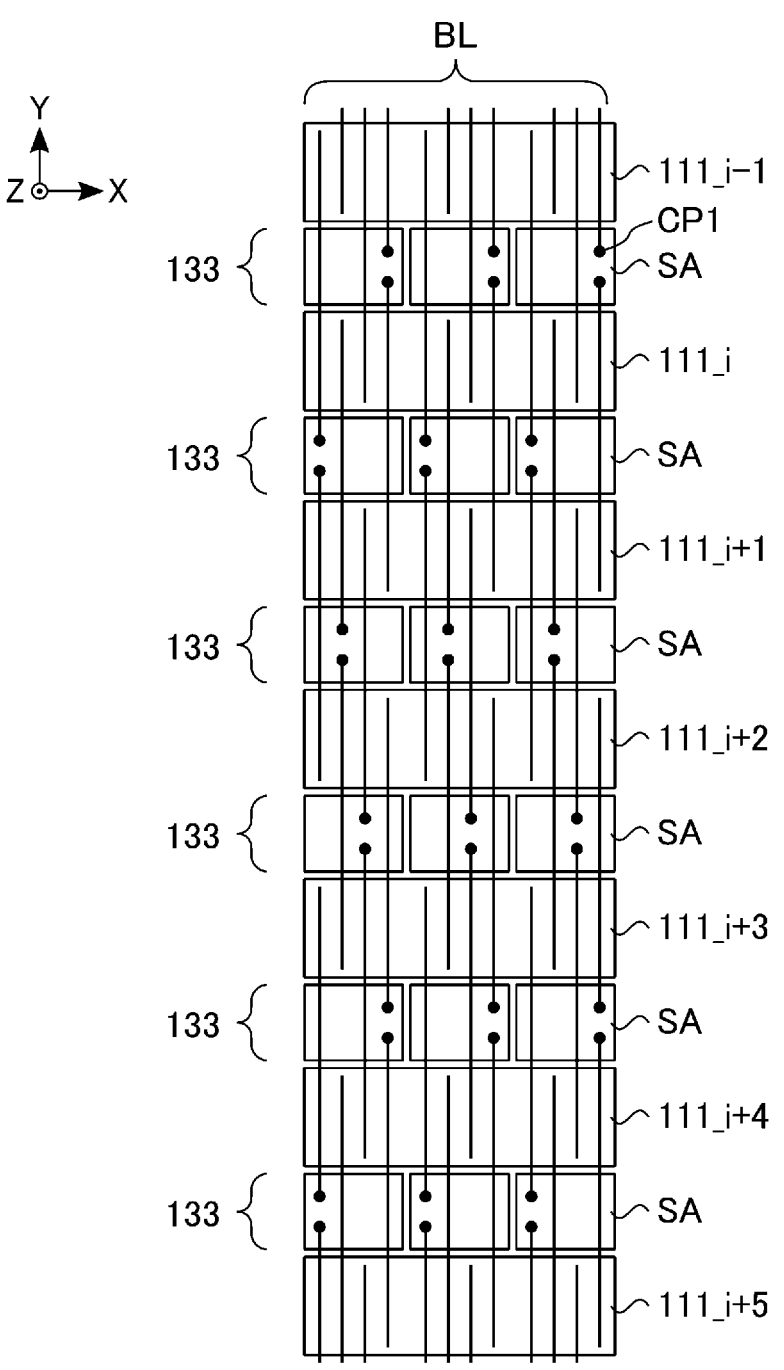
F I G. 12

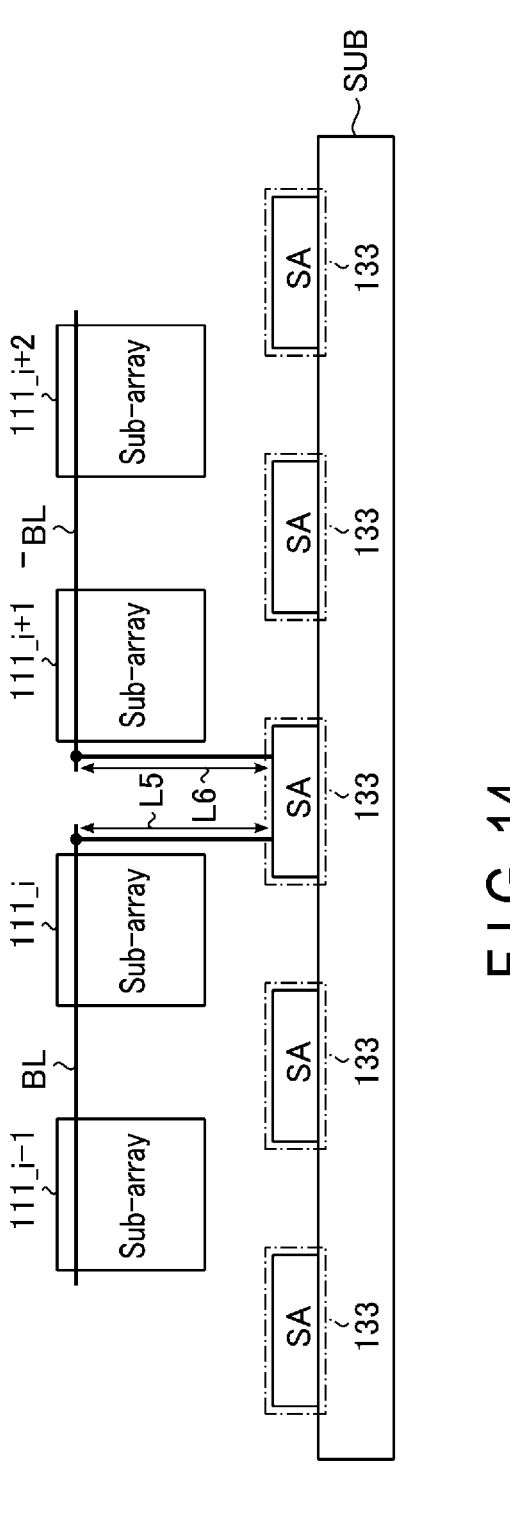
F I G. 14

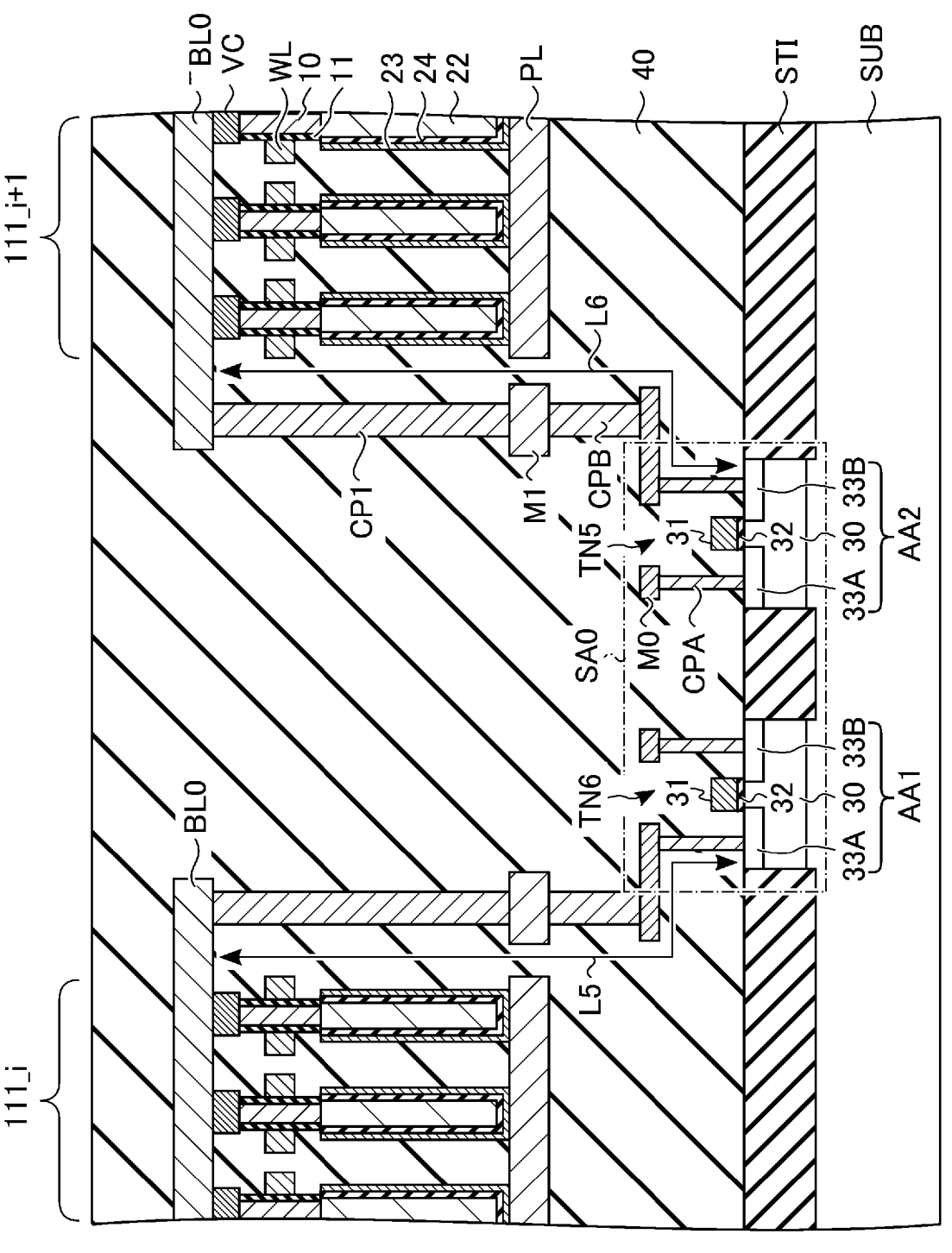
F I G. 15

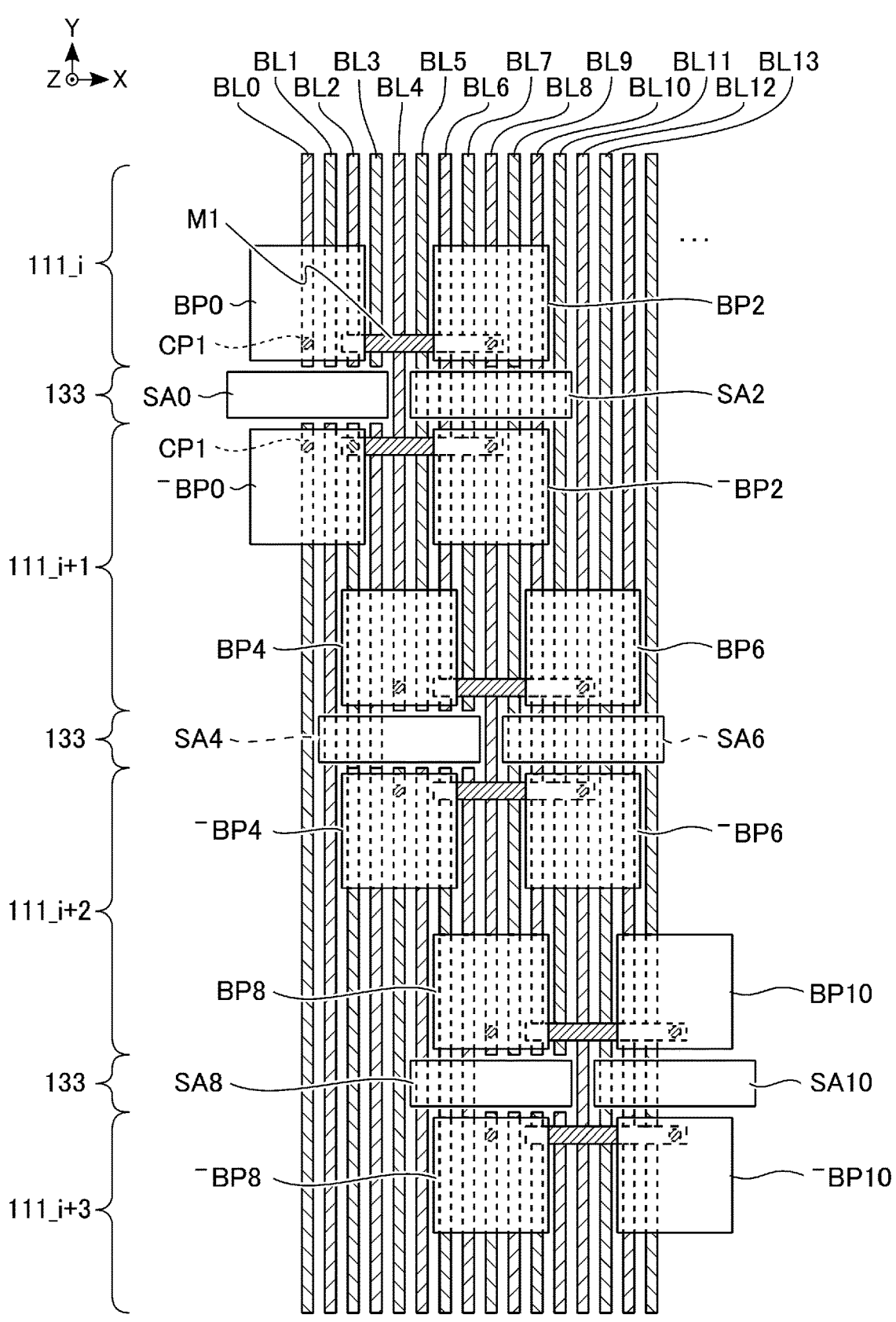
F I G. 16

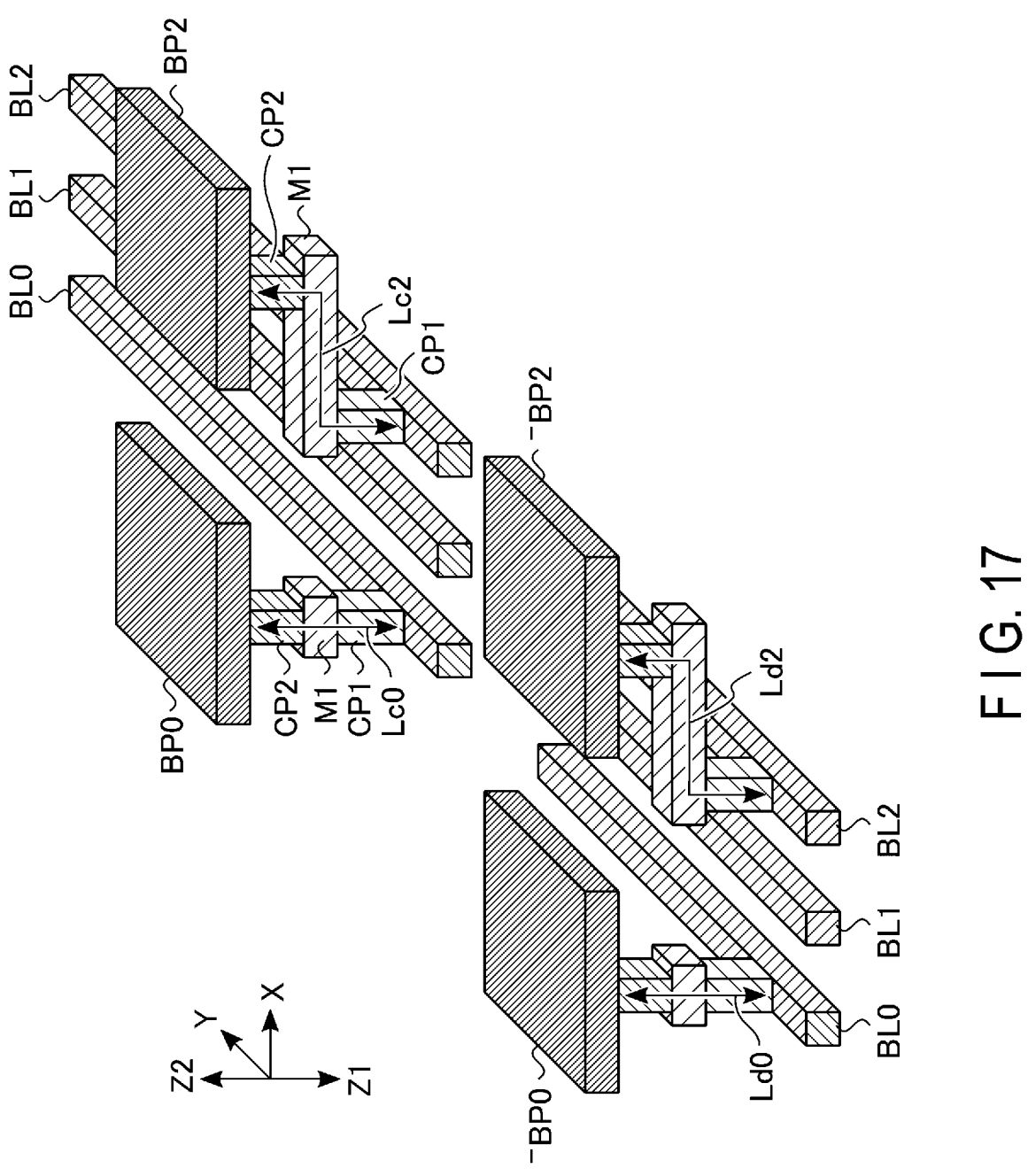
F I G. 17

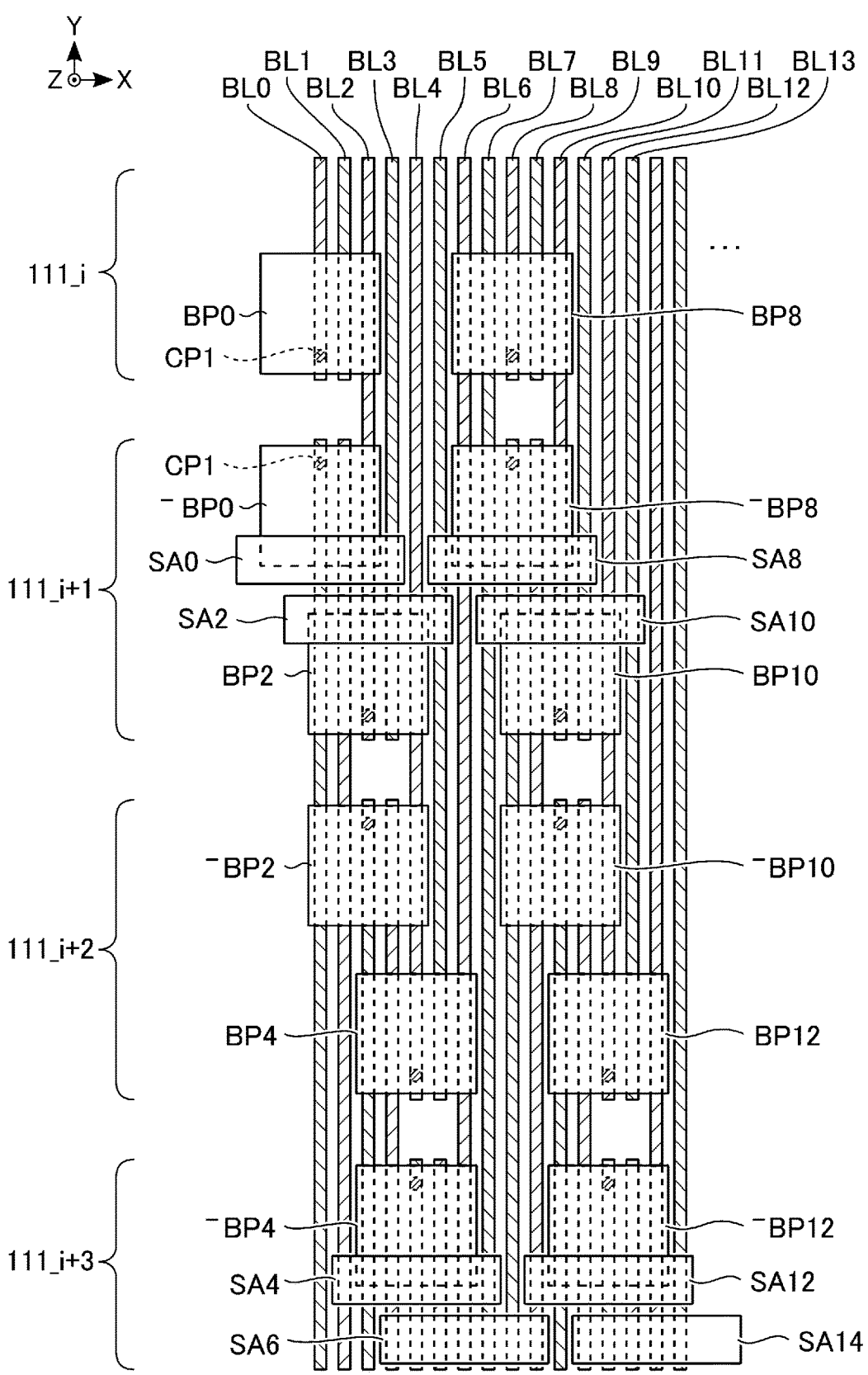
F I G. 18

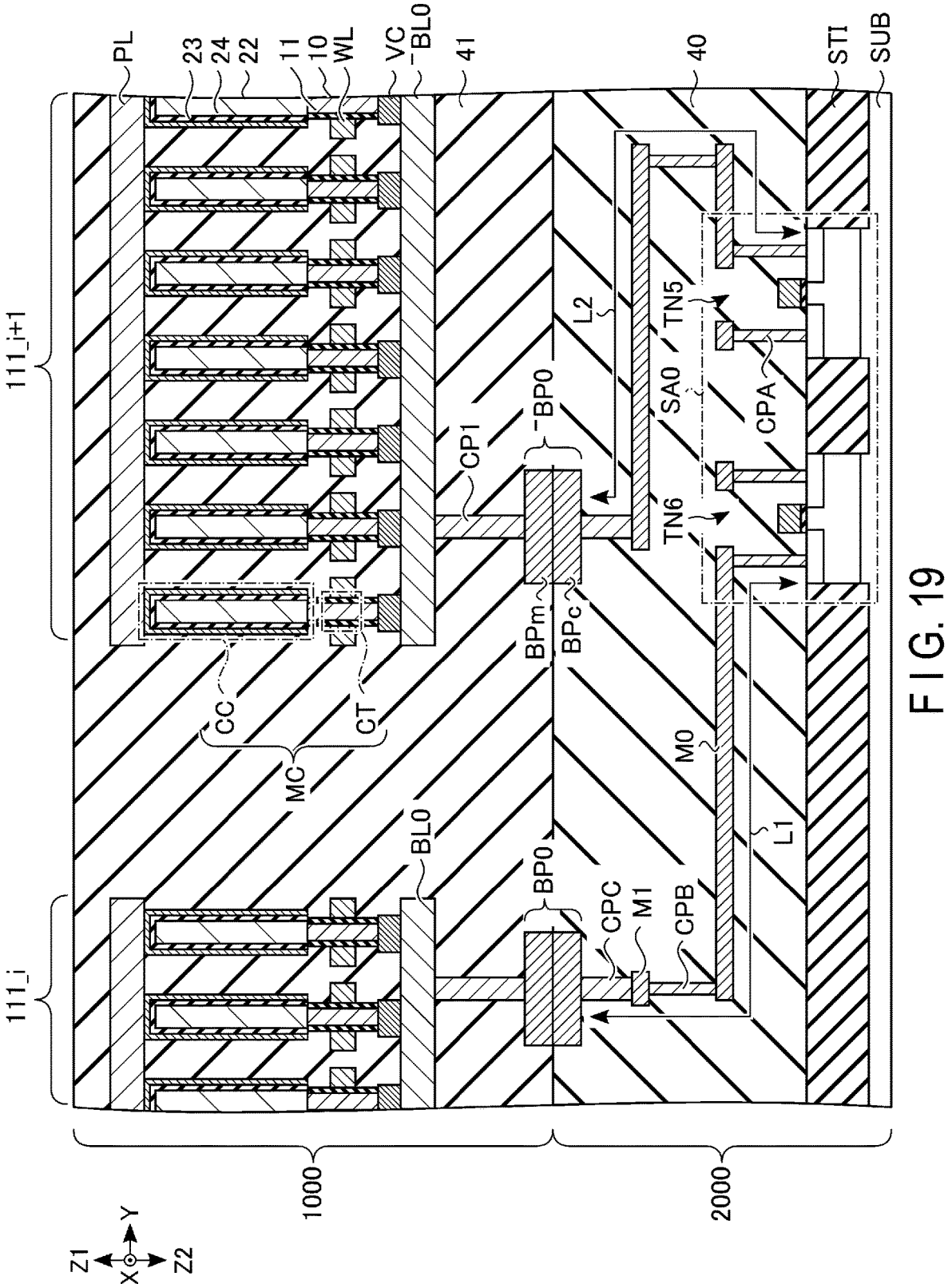
F I G. 19

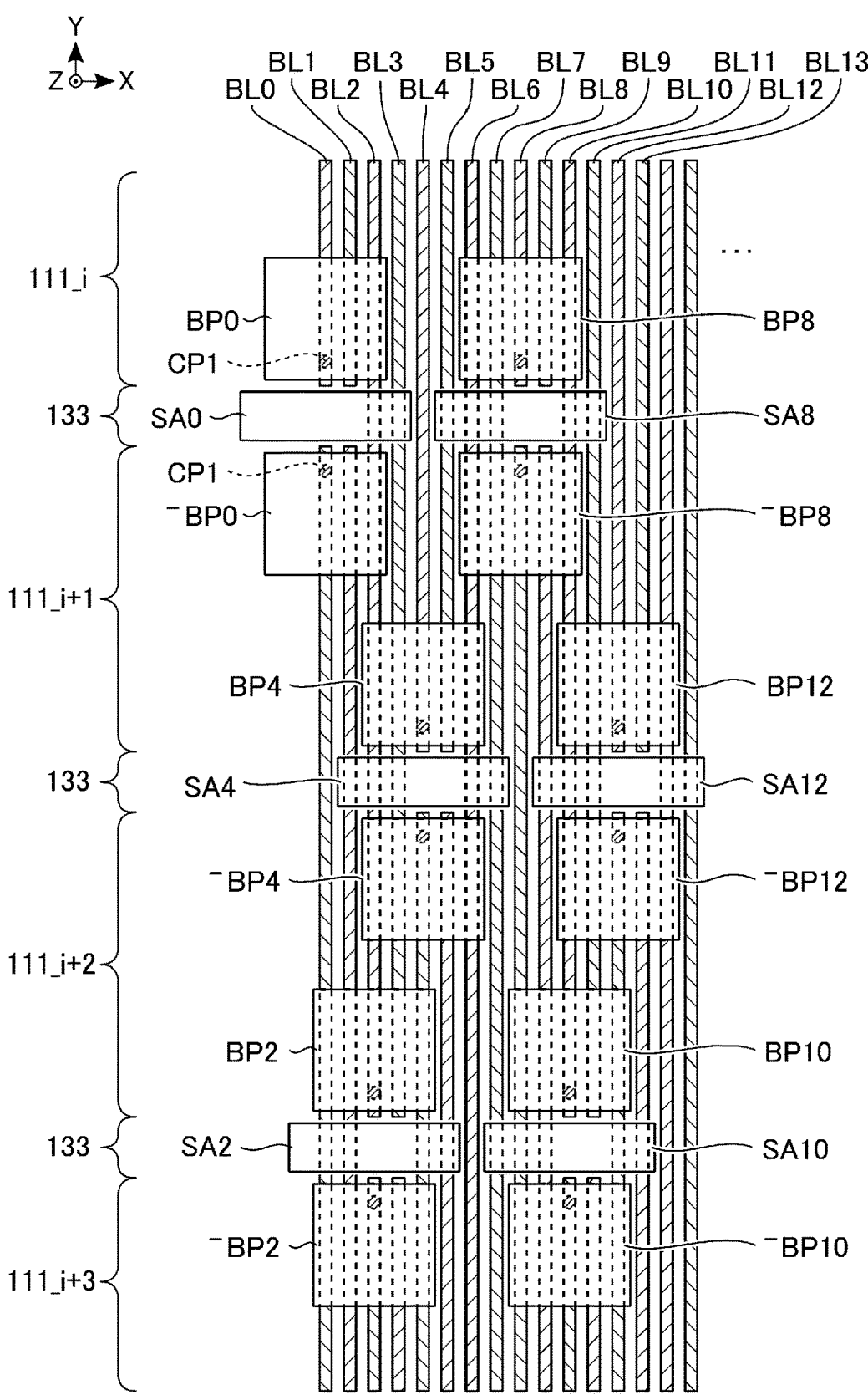
F I G. 20

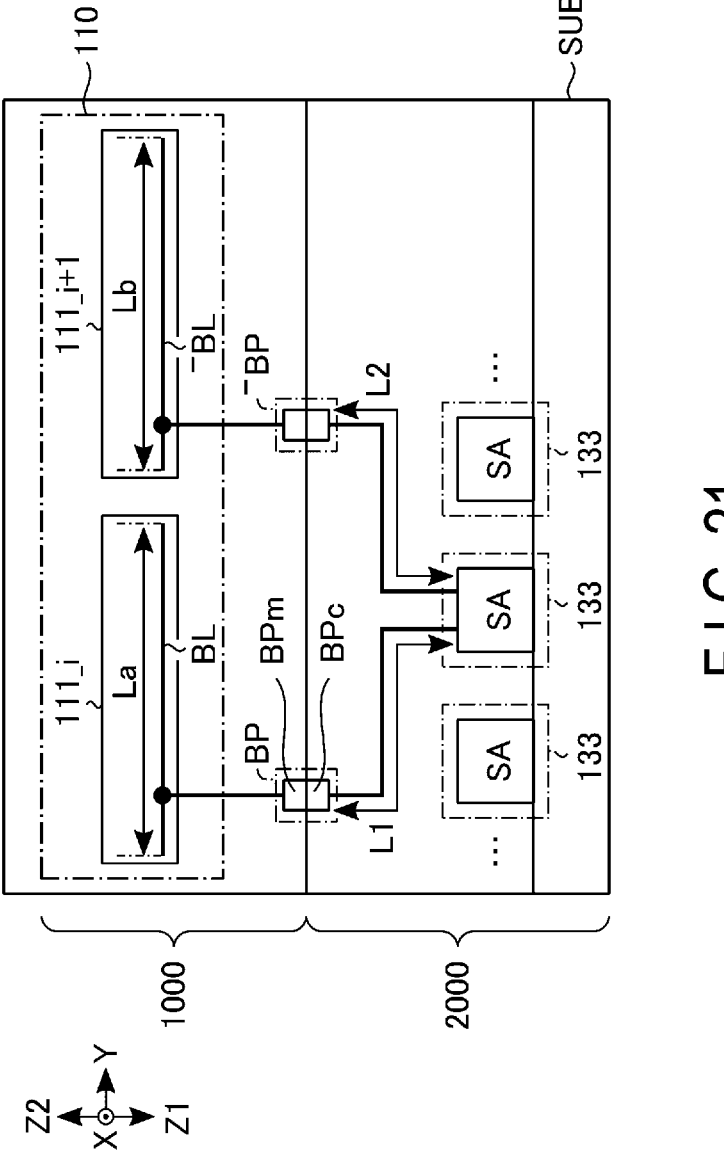
F I G. 21

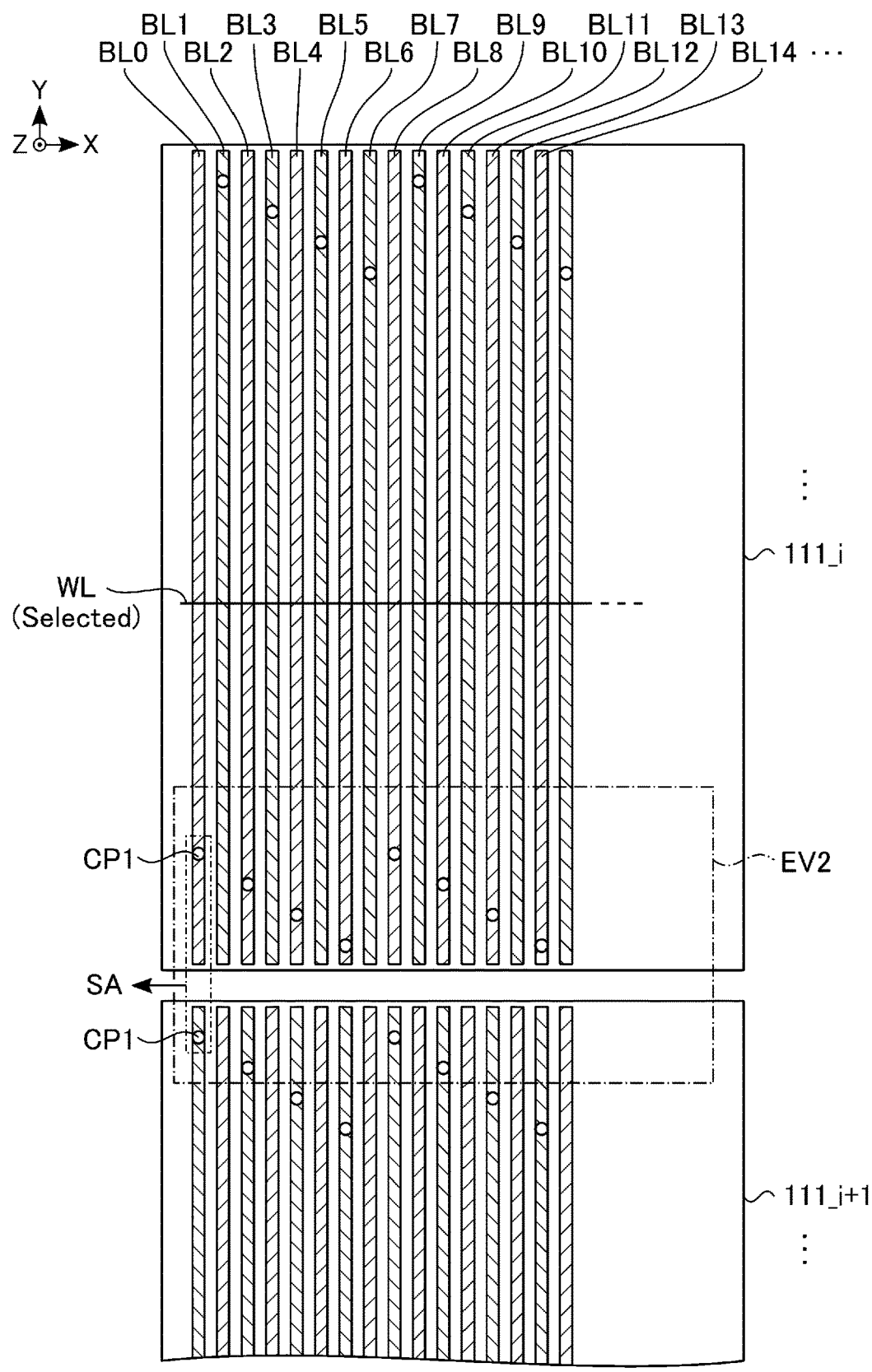
F I G. 22

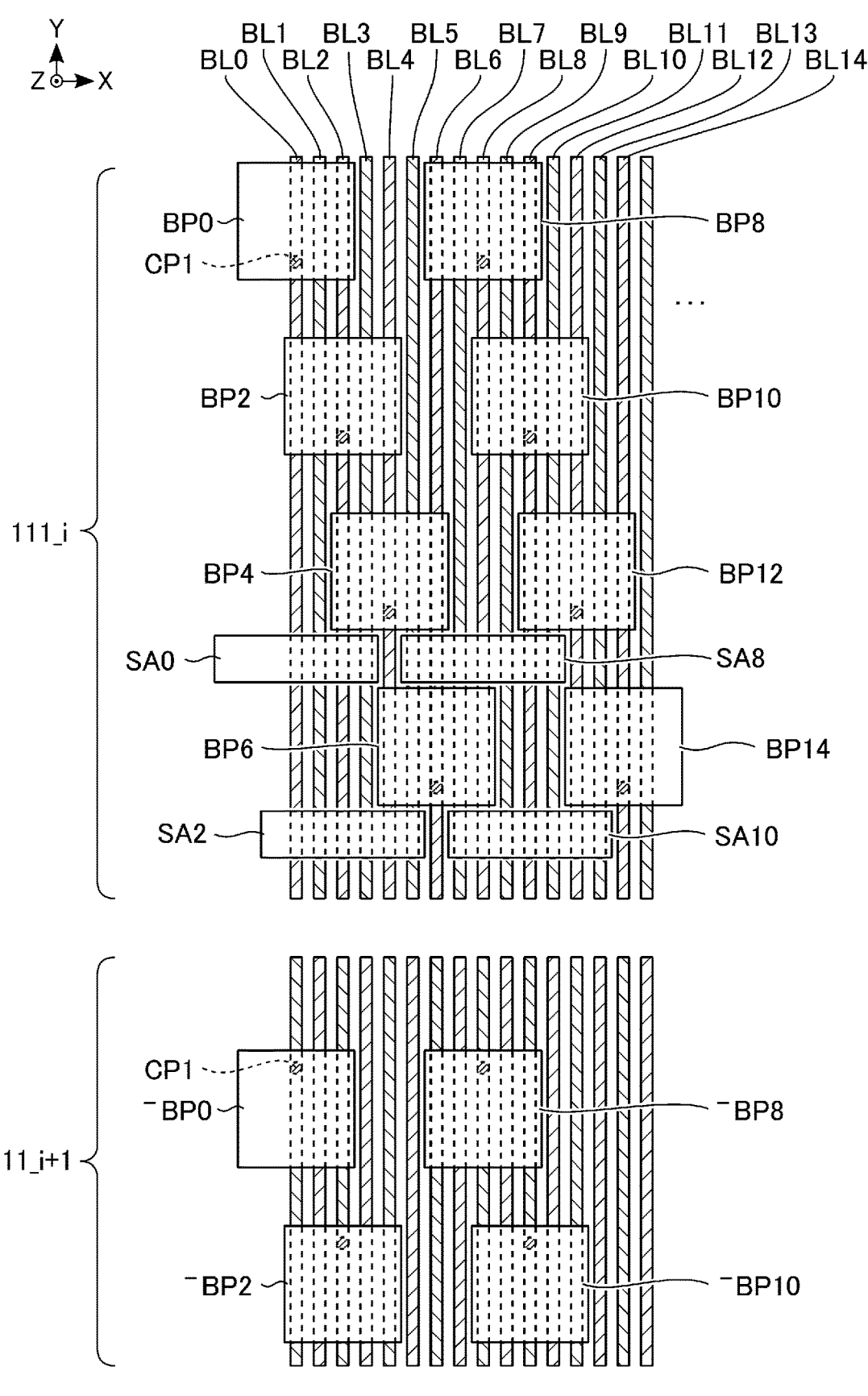
F I G. 23

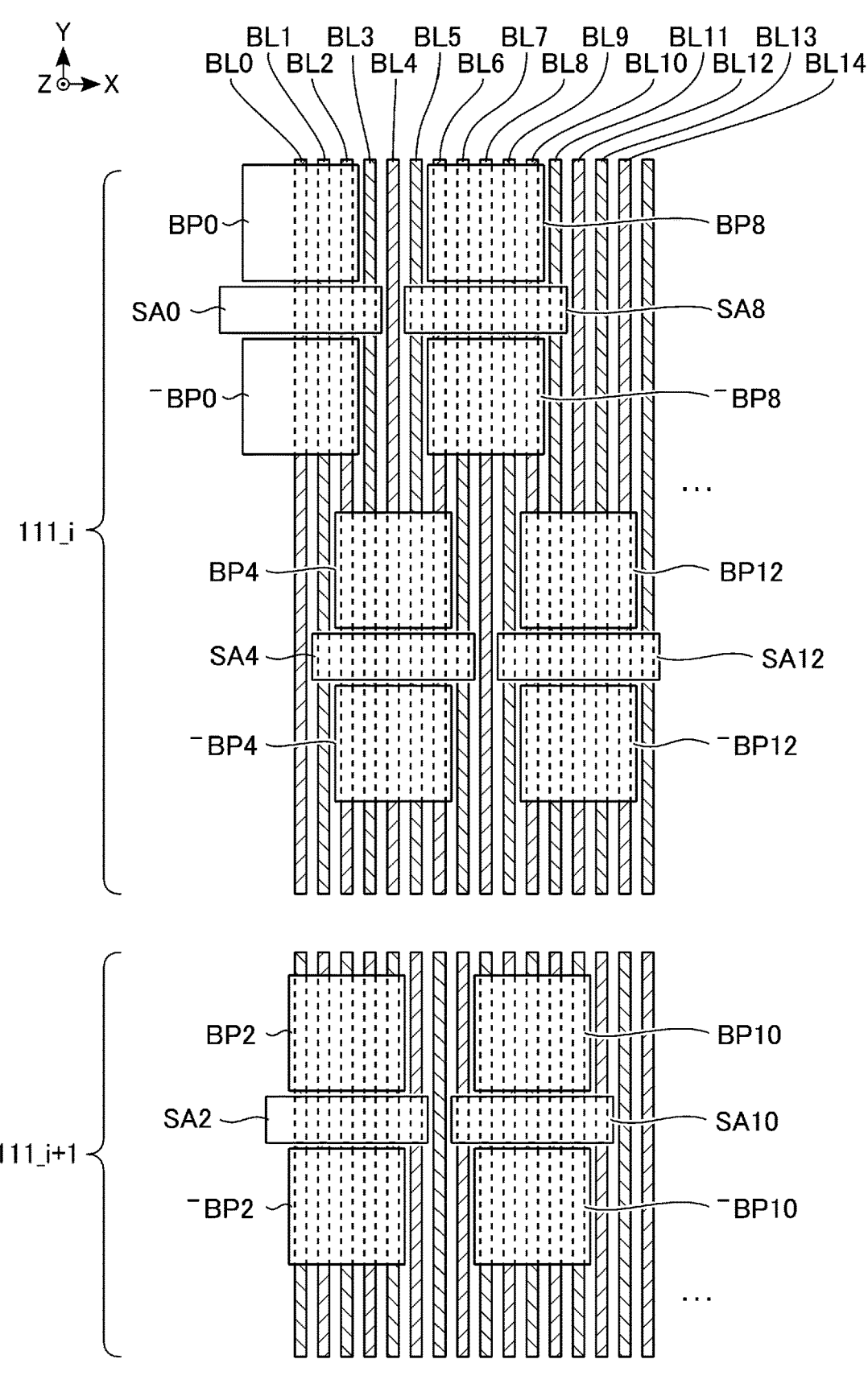
F I G. 24

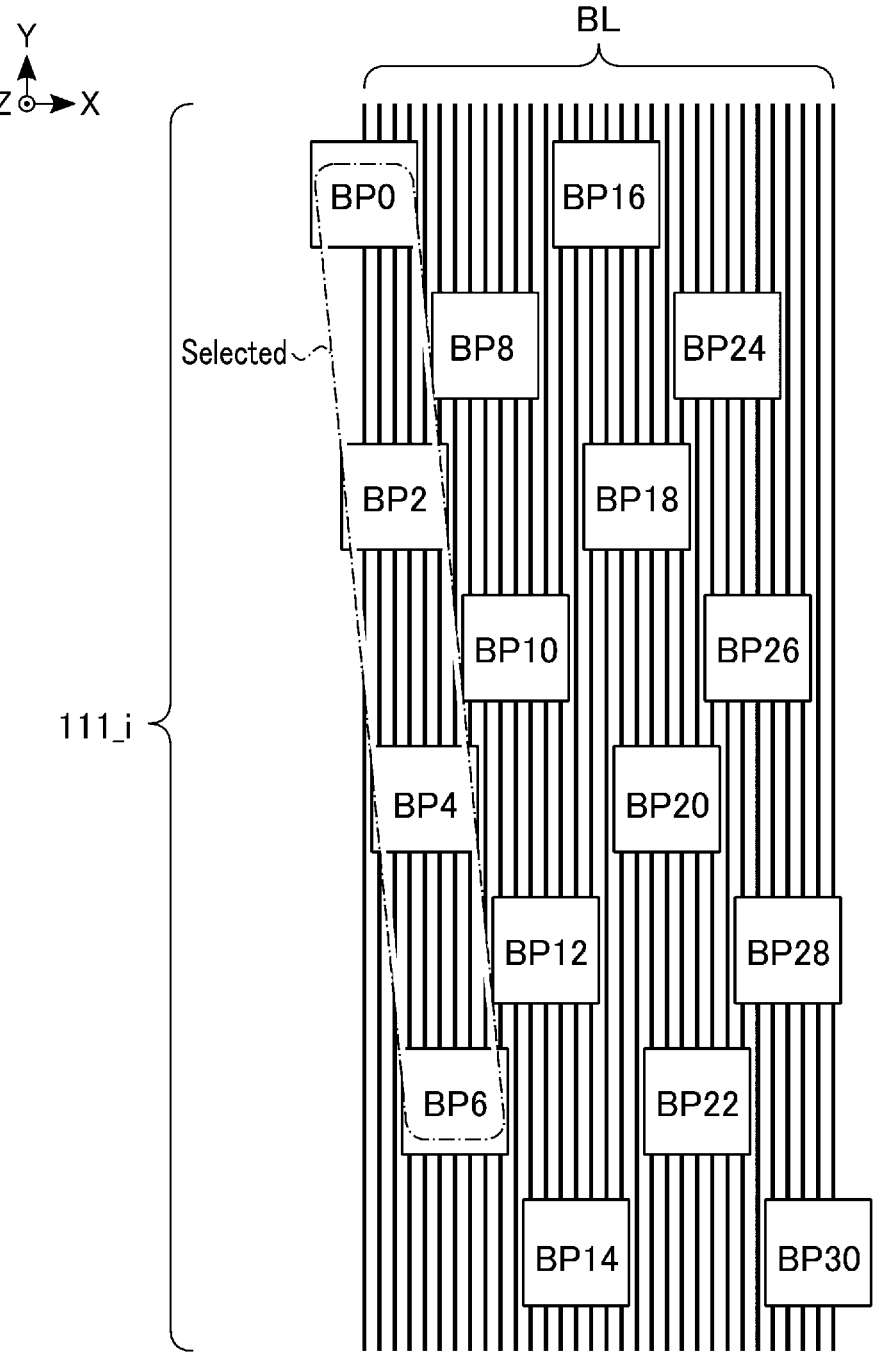
F I G. 25

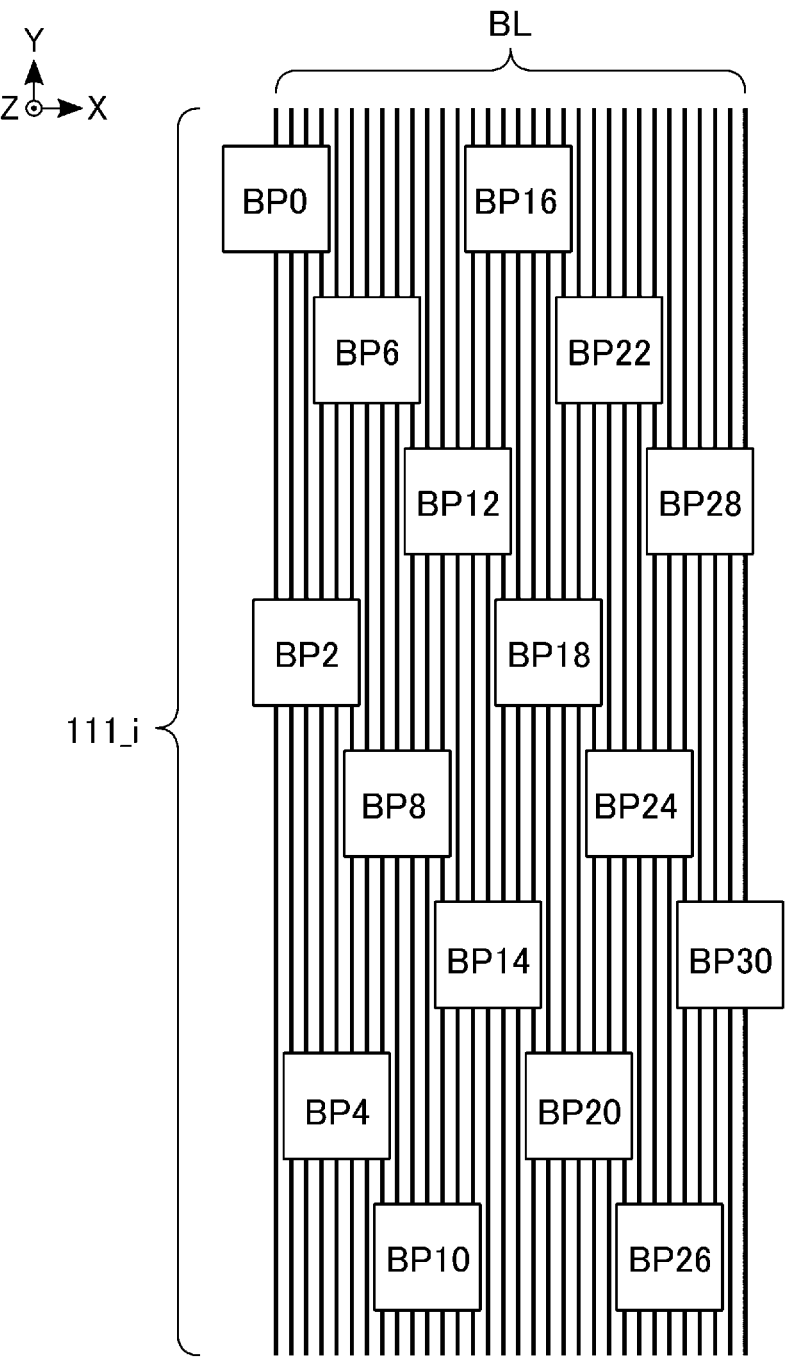
F I G. 26

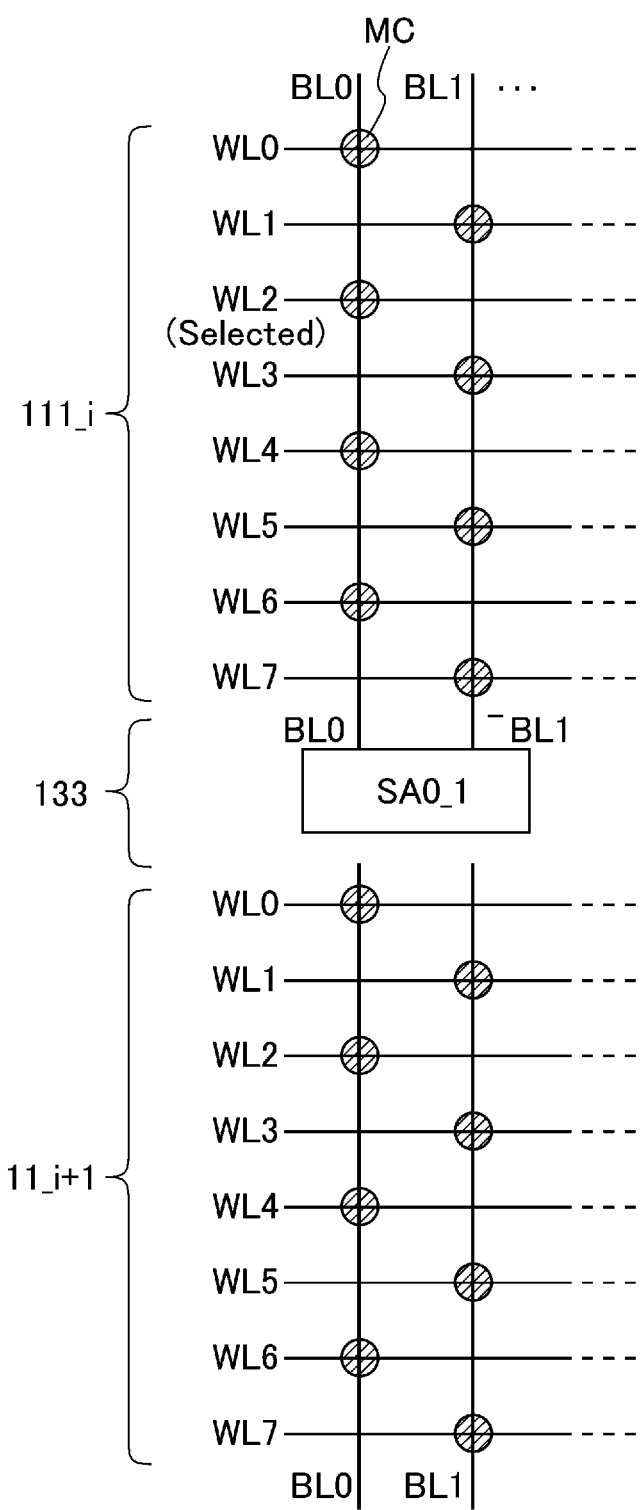
F I G. 27

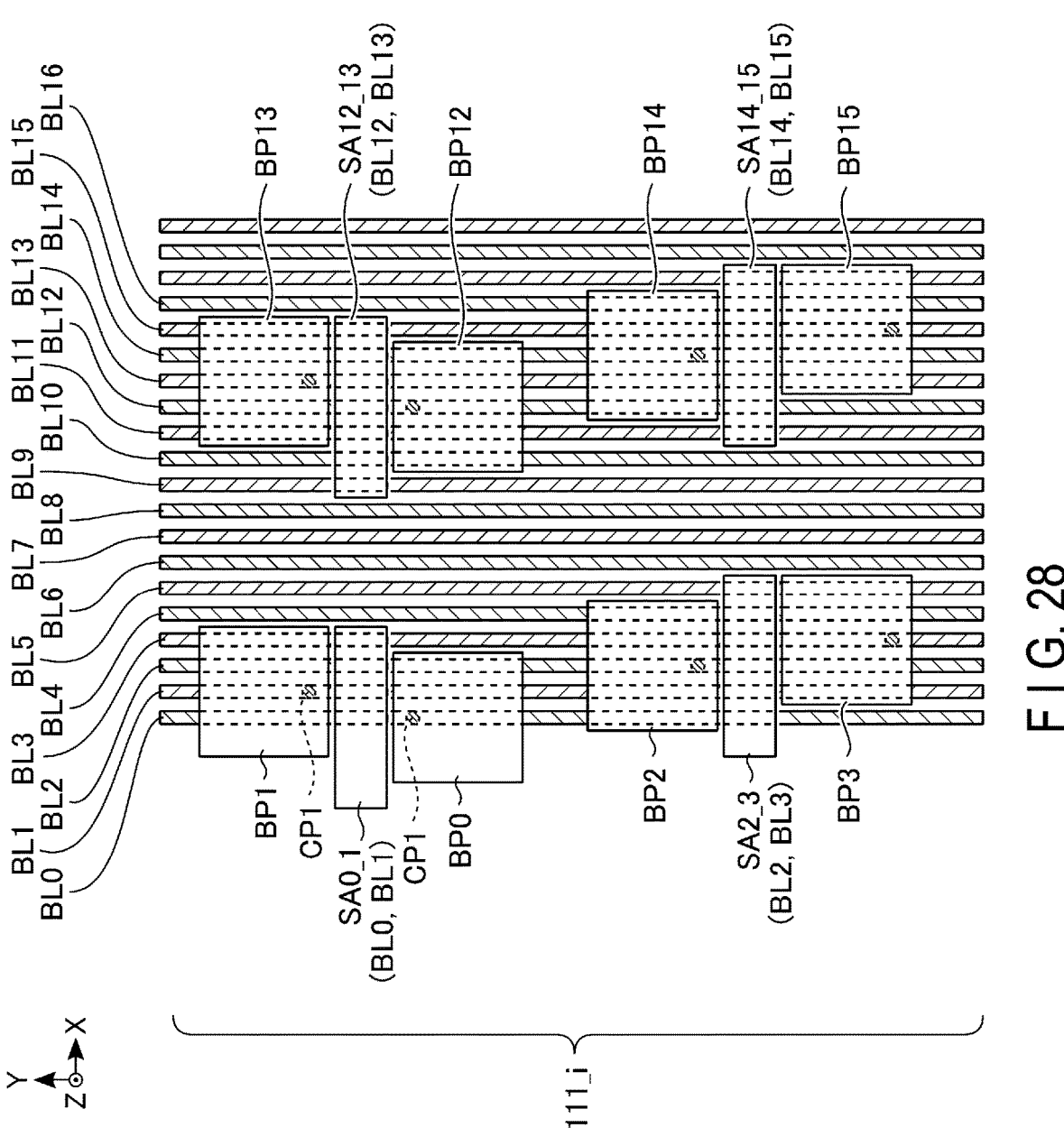
F I G. 28

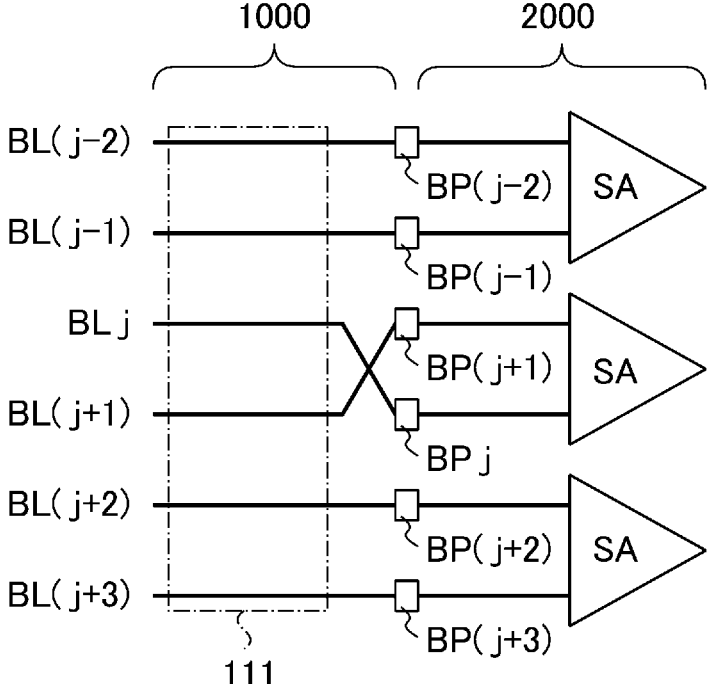
F I G. 29

MEMORY DEVICE

CROSS-REFERENCE TO RELATED APPLICATIONS

This application is based upon and claims the benefit of priority from Japanese Patent Application No. 2023-044215, filed Mar. 20, 2023, the entire contents of which are incorporated herein by reference.

FIELD

Embodiments described herein relate generally to a memory device.

BACKGROUND

As one type of a memory device, a dynamic random access memory (DRAM) has been known. The memory cells of a DRAM include capacitors and transistors. A memory device that adopts vertical transistors for the DRAM cells has also been known. A vertical transistor includes a semiconductor pillar as a channel, which extends in a direction intersecting the main surface of a semiconductor substrate. In the vertical transistor, a gate electrode is formed by an interconnect layer that extends in a direction along the main surface of the substrate and is provided in such a manner as to cover the periphery of the semiconductor pillar.

BRIEF DESCRIPTION OF DRAWINGS

FIG. 1 is a block diagram showing an exemplary configuration of a memory device according to a first embodiment.

FIG. 2 is a cross-sectional view showing an exemplary configuration of a chip of the memory device according to the first embodiment.

FIG. 3 is a circuit diagram of a memory cell array included in the memory device according to the first embodiment.

FIG. 4 is a perspective view showing an exemplary structure of a memory cell included in the memory device according to the first embodiment.

FIG. 5 is a schematic diagram showing an example of coupling between the memory cell array and a sense circuit included in the memory device according to the first embodiment.

FIG. 7 is a diagram showing a layout of bit lines in the memory cell array included in the memory device according to the first embodiment.

FIG. 8 is an enlarged view of a region EV1 shown in FIG. 7.

FIG. 9 is a cross-sectional view of the memory device taken along line A1-A2 in FIG. 8.

FIG. 10 is a perspective view showing an example of arrangement of sub-arrays and sense amplifiers included in the memory device according to a first modification example of the first embodiment.

FIG. 11 is a cross-sectional view showing the example of the arrangement of the sub-arrays and the sense amplifiers included in the memory device according to the first modification example of the first embodiment.

FIG. 12 is a cross-sectional view showing an example of arrangement of the sub-arrays and the sense amplifiers included in the memory device according to a second modification example of the first embodiment.

FIG. 14 is a cross-sectional view showing the example of the arrangement of the sub-arrays and the sense amplifiers included in the memory device according to the second modification example of the first embodiment.

FIG. 15 is a cross-sectional view of the memory device according to the second modification example of the first embodiment.

FIG. 16 is a diagram showing a layout of sense circuits, pads, and bit lines as viewed from a semiconductor substrate side in a memory device according to a first example of a second embodiment.

FIG. 17 is a perspective view showing the bit lines and the pads included in the memory device according to the first example of the second embodiment.

FIG. 18 is a diagram showing a layout of the sense circuits, the pads, and the bit lines as viewed from the semiconductor substrate side in the memory device according to a second example of the second embodiment.

FIG. 19 is a cross-sectional view of the memory device according to the second example of the second embodiment.

FIG. 20 is a diagram showing a layout of the sense circuits, the pads, and the bit lines as viewed from the semiconductor substrate side in the memory device according to a third example of the second embodiment.

FIG. 21 is a cross-sectional view showing an exemplary configuration of a chip of a memory device according to a third embodiment.

FIG. 22 is a diagram showing a layout of bit lines in a memory cell array included in the memory device according to the third embodiment.

FIG. 23 is an enlarged view of a region EV2 shown in FIG. 22.

FIG. 24 is a diagram showing a layout of sense circuits, pads, and bit lines as viewed from a semiconductor substrate side in a memory device according to a first example of a fourth embodiment.

FIG. 25 is a diagram showing a layout of the pads and the bit lines included in the memory device according to a second example of the fourth embodiment.

FIG. 26 is a diagram showing a layout of the pads and the bit lines included in the memory device according to a third example of the fourth embodiment.

FIG. 27 is a schematic diagram showing an example of coupling between a memory cell array and a sense circuit included in a memory device according to a fifth embodiment.

FIG. 28 is a diagram showing a layout of sense circuits, pads, and bit lines as viewed from a semiconductor substrate side in the memory device according to the fifth embodiment.

FIG. 29 is a conceptual diagram showing coupling between the bit lines and the sense circuits included in the memory device according to the fifth embodiment.

DETAILED DESCRIPTION

Figure 6:
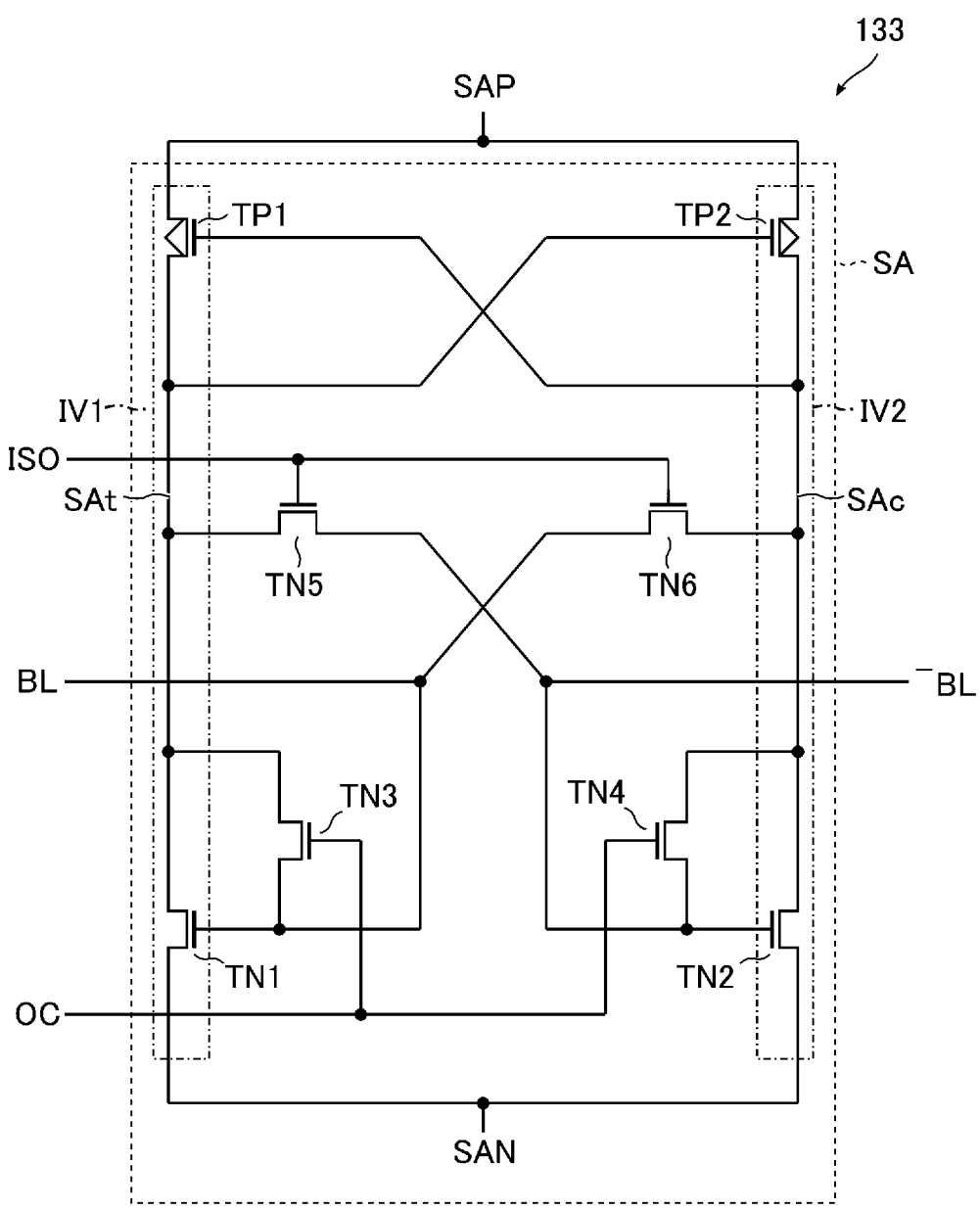
FIG. 6 is a circuit diagram of the sense circuit included in the memory device according to the first embodiment.

In general, according to one embodiment, a memory device includes: a memory cell array including a first sub-array including a plurality of first memory cells, a second sub-array including a plurality of second memory cells, a third sub-array including a plurality of third memory cells, and a fourth sub-array including a plurality of fourth memory cells; a first bit line coupled to the first sub-array and the second sub-array and extending in a first direction; a second bit line arranged side by side with the first bit line in the first direction and coupled to the third sub-array and the fourth sub-array; a third bit line arranged at a position different from the first bit line in a second direction intersecting the first direction and coupled to at least the second sub-array and the third sub-array; a fourth bit line arranged side by side with the third bit line in the first direction and coupled to the fourth sub-array; a first circuit electrically coupled to the first bit line and the second bit line; and a second circuit electrically coupled to the third bit line and the fourth bit line.

Embodiments will be described below with reference to the drawings. Multiple components having substantially the same function and configuration in one or different embodiments may be appended with additional numbers or letters at the end of a reference numeral to distinguish them from one another. In an embodiment subsequent to a described embodiment, differences from the described embodiment are mainly described. All descriptions of an embodiment also apply as descriptions of another embodiment unless explicitly or explicitly excluded.

In the present specification and claims, a first element being "coupled" to another second element may be the first element being coupled to the second element directly or via an element that constantly or selectively conductive.

1. First Embodiment

First, a memory device according to a first embodiment will be described below.

1.1 Overall Configuration of Semiconductor Memory Device

First, an example of an overall configuration of the memory device 100 will be described with reference to FIG. 1. FIG. 1 is a block diagram showing an exemplary overall configuration of the memory device 100. In FIG. 1, parts of coupling between components are indicated by arrow lines, but the coupling between the components is not limited thereto. A case where the memory device 100 is a dynamic random access memory (DRAM) will be described.

The memory device 100 is electrically connected to an externally provided memory controller 200, as illustrated in FIG. 1. The memory device 100 is configured to read and write data in response to commands from the memory controller 200. The memory device 100 receives, for example, an address ADR, a command CMD, data DT, and a control signal CNT from the memory controller 200. The memory device 100 also transmits the control signal CNT and data DT to the memory controller 200. The memory device 100 includes, for example, a memory cell array 110, a row control circuit 120, a column control circuit 130, a read/write circuit 140, an input/output circuit 150, and a control circuit 160.

The memory cell array 110 is used for data storage. The memory cell array 110 includes a plurality of sub-arrays 111. In the example illustrated in FIG. 1, the memory cell array 110 includes n+1 (n is an integer of 1 or more) sub-arrays 111_0 to 111_n. Each of the sub-arrays 111 includes a plurality of memory cells MC, a plurality of word lines WL, and a plurality of bit lines BL. A memory cell MC may store therein data of one bit or more. Each of the memory cells MC is coupled between a single word line WL and a single bit line BL. Each of the memory cells MC is coupled between a bit line BL and a plate line (not illustrated). Each word line WL has a row address assigned. Each bit line BL has a column address assigned. Each memory cell MC can be identified by a row address and a column address.

The row control circuit 120 controls interconnects (e.g., word lines WL) assigned in the row direction in the memory cell array 110. The row control circuit 120 selects (activates) a word line WL according to the address ADR. Hereinafter, the selected word line WL is also referred to as a "selected word line WL". The row control circuit 120 also sets non-selected word lines WL to a non-selected state (i.e., deactivates the word line WL). Thereafter, the row control circuit 120 supplies prescribed voltages to the selected word line WL and to the non-selected word lines WL. The row control circuit 120 may include a driver circuit 121 and an address decoder 122. The driver circuit 121 generates voltages to be applied to the word lines WL. The address decoder 122 decodes the address ADR. The row control circuit 120 selects a word line WL based on the decoding result obtained by the address decoder 122. The row control circuit 120 may also be referred to as a row decoder.

The column control circuit 130 controls interconnects (e.g., bit lines BL) assigned in the column direction in the memory cell array 110. The column control circuit 130 may include an address decoder 131, a column selection circuit 132, and a plurality of sense amplifiers 133. The address decoder 131 decodes the address ADR. The sense amplifiers 133 are coupled to the bit lines BL. The sense amplifiers 133 are divided and arranged at a plurality of positions corresponding to the coupled bit lines BL.

Each of the sense amplifiers 133 performs the following operation according to operations of the sub-arrays 111 coupled to the sense amplifier 133. When one of the word lines WL of any of the sub-arrays 111 is activated (selected) by the row control circuit 120, the potentials of the bit lines BL coupled to the selected word line WL change due to data (charges) stored in the memory cells MC (hereinafter, also referred to as "selected memory cells MC") coupled to the selected word line WL. The sense amplifier 133 amplifies the changes in the potentials of the bit lines BL to a potential that can be read by a read circuit. In addition, the sense amplifier 133 restores the original data by the amplified potentials in the memory cells MC in which the data (charges) disappears by being read to the bit lines BL. As described above, the sense amplifier 133 operates with respect to the bit lines BL included in the sub-array 111 in which the word line WL is activated by the row control circuit 120. The column selection circuit 132 controls data exchange between the bit line BL, which is designated by the column address out of the word line WL and the bit lines BL activated in the operation of the sense amplifier 133, and the read/write circuit 140. In the read operation, the column selection circuit 132 outputs, to the read circuit, data of the designated bit line BL among the bit lines BL at the potentials amplified by the sense amplifier 133. In the write operation, the column selection circuit 132 changes the voltage level of the designated bit line BL to a level that corresponds to the write data, and stores the new data into the memory cell MC. The column control circuit 130 may also be referred to as a column decoder.

Each of the sense amplifiers 133 includes a plurality of sense circuits according to the number of bit lines BL. Two bit lines BL coupled to different memory cells MC are coupled to each of the sense circuits. For example, in the read operation, one bit line BL coupled to the sense circuit is coupled to a selected memory cell MC. The other bit line BL is not coupled to the selected memory cell MC. In such a case, the other bit line BL functions as a node having a reference potential. The reference potential is used to determine data stored in the memory cell MC from which data is to be read. In a case where the bit line BL coupled to the selected memory cell MC is limited, the bit line BL coupled to the selected memory cell MC is also referred to as a selected bit line BL. In addition, the bit line BL functioning as the node having the reference potential is also referred to as a complementary bit line ⁻BL.

The read/write circuit 140 performs a data write operation to memory cell arrays 110 and a data read operation from memory cell arrays 110. In the write operation, the read/write circuit 140 sends a signal (voltage or current) corresponding to the data requested to be written into the memory cell array 110, to the memory cell array 110 via the column control circuit 130. In the read operation, a signal (a voltage or a current) corresponding to the data read from the memory cell array 110 is received from the memory cell array 110 via the column control circuit 130. The memory device 100 may include a circuit for the write operation and a circuit for the read operation that are independently provided.

The input/output circuit 150 is an interface circuit that controls the communications between the memory device 100 and memory controller 200. The input/output circuit 150 receives a command CMD, an address ADR, data DT (e.g., data requested to be written into the memory cell array 110), control signals CNT, and the like from the memory controller 200. The input/output circuit 150 sends the control signal CNT and data DT (e.g., data read from the memory cell array 110) to the memory controller 200.

The control circuit 160 controls the row control circuit 120, column control circuit 130, read/write circuit 140, and the like, based on the command CMD and control signal CNT, so as to realize the operations that are to be executed by the memory device 100. If the memory device 100 is a DRAM, the control circuit 160 executes a refresh operation upon the data in the memory cell array 110, in addition to the write operation and the read operation. The refresh operation is an operation of reading data stored in each memory cell MC to the bit line BL by activating a word line WL and writing data read by the sense amplifier 133 back to the memory cell MC. The control circuit 160 further controls the row control circuit 120, column control circuit 130, read/write circuit 140, and the like at a timing synchronized with a clock signal CLK. In other words, in the memory device 100, the write operation and read operation are executed at a timing synchronized with the clock signal CLK. The clock signal CLK may be generated inside the memory device 100, or may be externally supplied. The control circuit 160 may also be referred to as a sequencer or internal controller.

The memory device 100 is not limited to the above described structure. For instance, the memory device 100 may include a control circuit for controlling a refresh operation, a clock generation circuit, an internal voltage generation circuit, and the like.

1.2 Configuration of Chip

Next, an example of a configuration of a chip will be described with reference to FIG. 2. FIG. 2 is a cross-sectional view showing an example of the configuration of the chip of the memory device 100. In the example illustrated in FIG. 2, the memory cell array 110 and the sense amplifiers 133 are illustrated in order to simplify the description, and other circuits are omitted.

Hereinafter, a direction in which the word lines WL extend in the memory cell array 110 is referred to as an X direction. A direction which intersects with the X direction and in which the bit lines BL extend is referred to as a Y direction. A direction intersecting the X direction and the Y direction is referred to as a Z direction. In a case where the Z direction is limited, a direction from a circuit chip 2000 (including a semiconductor substrate SUB) toward an array chip 1000 (memory cell array 110) is referred to as a Z1 direction, and a direction opposite to the Z1 direction is referred to as a Z2 direction. Furthermore, in the following description, in a case where lengths, sizes, or the like are described as being "substantially the same", it indicates a state in which comparison targets are designed to be the same in the design of the memory device 100. Therefore, in a case where lengths, sizes, or the like are described as being "substantially the same", it may include a variation error due to manufacturing.

As illustrated in FIG. 2, the memory device 100 includes the array chip 1000 and the circuit chip 2000. The array chip 1000 includes the memory cell array 110. The circuit chip 2000 includes a circuit that controls the array chip 1000. More specifically, the circuit chip 2000 includes the row control circuit 120, the column control circuit 130, the read/write circuit 140, the input/output circuit 150, and the control circuit 160.

The memory device 100 according to the present embodiment has a structure (hereinafter, also referred to as a "bonding structure") in which the array chip 1000 and the circuit chip 2000 are bonded together. The memory device 100 may include a plurality of array chips 1000 stacked in the Z direction. In addition, the memory device 100 may not have the bonding structure.

In the Z1 direction, the array chip 1000 is bonded onto the circuit chip 2000. Hereinafter, a surface on which the circuit chip 2000 and the array chip 1000 are bonded is referred to as a bonding surface.

The array chip 1000 includes a plurality of bonding pads BPm provided on the bonding surface. Similarly, the circuit chip 2000 includes a plurality of bonding pads BPc provided on the bonding surface. In the bonding structure, each of the bonding pads BPm of the array chip 1000 and each of the bonding pads BPc of the circuit chip 2000 are bonded to form a single bonding pad BP. The pad BP functions as a part of a current path electrically coupling the array chip 1000 to the circuit chip 2000.

The array chip 1000 includes the memory cell array 110. The memory cell array 110 includes a plurality of sub-arrays 111. Hereinafter, in a case where any of the plurality of sub-arrays 111 is indicated, the sub-array 111 may be described as a sub-array $111\_i$ by using a variable i (i is an integer from 0 to n). In the example illustrated in FIG. 2, the memory cell array 110 includes four sub-arrays $111\_i-1$, $111\_i$, $111\_i+1$, and $111\_i+2$ arranged side by side in the Y direction.

Each of the bit lines BL is coupled to a plurality of sub-arrays 111. That is, the plurality of sub-arrays 111 share the bit line BL. For example, the bit lines BL extend in the Y direction. In the example illustrated in FIG. 2, the selected bit line BL coupled to the sub-arrays $111\_i-1$ and $111\_i$ and the complementary bit line ⁻BL coupled to the sub-arrays $111\_i+1$ and $111\_i+2$ are illustrated. The lengths of the selected bit line BL and the complementary bit line ⁻BL are substantially the same. For example, in a case where the length of the selected bit line BL illustrated in FIG. 2 is La and the length of the complementary bit line ⁻BL is Lb, there is a relationship of La=Lb.

The plurality of sense amplifiers 133 are dispersedly arranged on the semiconductor substrate SUB of the circuit chip 2000. Each of the sense amplifiers 133 includes a plurality of sense circuits SA. In the present embodiment, as viewed from the Z direction, each of the sense amplifiers 133 is arranged in a region (hereinafter, it is also referred to as a "region between the sub-arrays 111") between two adjacent sub-arrays 111 in the Y direction. That is, the sub-arrays 111 and the sense amplifiers 133 are alternately arranged in the Y direction. In the bonding structure, the positions of the sub-arrays 111 are different from the positions of the sense amplifiers 133 in the Z direction. Therefore, a part of the region of each of the sub-arrays 111 and a part of the region of each of the sense amplifiers 133 may overlap in the Y direction. Each of the sense amplifiers 133 includes a plurality of sense circuits SA arranged in a row in the X direction.

For example, the selected bit line BL is coupled to the sense circuit SA via the pad BP. Furthermore, the complementary bit line $^-$BL is coupled to the sense circuit SA via the pad $^-$BP. The sense circuit SA is arranged between the sub-array 111 to which the selected bit line BL is coupled and the sub-array 111 to which the complementary bit line $^-$BL is coupled in the Y direction. In other words, the sense circuit SA is arranged (intermediate) between the pad BP and the pad $^-$BP in the Y direction. Therefore, the distance from the pad BP to the sense circuit SA and the distance from the pad $^-$BP to the sense circuit SA are substantially the same.

Each of the pads BP and $^-$BP is electrically coupled to the sense circuit SA via a plurality of interconnects and contact plugs. A length of a current path (including a plurality of interconnects and contact plugs) from the pad BP to which the selected bit line BL is coupled to the sense circuit SA is L1. In addition, a length of a current path from the pad $^-$BP to which the complementary bit line $^-$BL is coupled to the sense circuit SA is L2. The length L1 and the length L2 of the current paths are substantially the same. That is, the length L1 and the length L2 of the current paths have a relationship of L1=L2.

1.3 Circuit Configuration of Memory Cell Array

Next, an example of a circuit configuration of the memory cell array 110 will be described with reference to FIG. 3. FIG. 3 is a circuit diagram of the memory cell array 110.

As illustrated in FIG. 3, the plurality of memory cells MC are arranged in a matrix (or zigzag pattern) on a plane (XY plane) including the X direction and the Y direction. The memory cell array 110 further includes the plate line PL.

A plate voltage level, for example a ground voltage level, is applied to the plate line PL. One end of each of the memory cells MC is coupled to the plate line PL. The other end of each of the memory cells MC is coupled to the bit line BL associated with the memory cell MC. The plate line PL may also be referred to as a "plate electrode". The plate line PL may be divided into parts in accordance with control units of the control sub-array 111.

Each memory cell MC includes a cell transistor CT and a cell capacitor CC. The cell transistor CT and cell capacitor CC of the memory cell MC are serially coupled between the associated bit line BL and the plate line PL. In particular, in each memory cell MC, one end of the cell transistor CT is coupled to its associated bit line BL, and the other end of the cell transistor CT is coupled to a node ND. Furthermore, in each memory cell MC, one electrode of the cell capacitor CC is coupled to the node ND, and the other end of the cell capacitor CC is coupled to the plate line PL. Each of the cell transistors CT is a field effect transistor. Each of the cell capacitors CC is a capacitance element. Each of the cell transistors CT may be simply referred to as a "transistor". Each of the cell capacitors CC may be simply referred to as a "capacitor".

The plurality of word lines WL included in the memory cell array 110 extend in the X direction and are arranged side by side in the Y direction. Each word line WL is coupled to the gate ends of the cell transistors CT of the memory cells MC that are arranged in the X direction. In other words, each word line WL is coupled to the gate ends of the cell transistors CT of the memory cells MC that have the same row address. The gate end of each cell transistor CT may also be referred to as a "control end of the memory cell MC".

The plurality of bit lines BL included in the memory cell array 110 extend in the Y direction and are arranged side by side in the X direction. Each bit line BL is coupled to ends of the cell transistors CT of the memory cells MC arranged in the Y direction. In other words, each bit line BL is coupled to the ends of the cell transistors CT of the memory cells MC that have the same column address.

A cell transistor CT is a switch configured to switch between an electrically connected state and electrically insulated state for the connection between the memory cell MC and bit line BL. The cell transistor CT serves as a select element of the memory cell MC. One end of the cell transistor CT serves as one of a source end and drain end of the transistor, while the other end of the cell transistor CT serves as other one of a drain end and source end of the transistor. A cell capacitor CC holds an amount of charge corresponding to data of one or more bits. The cell capacitor CC serves as a memory element of the memory cell MC.

1.4 Structure of Each Memory Cell

Next, an example of a structure of each memory cell MC will be described with reference to FIG. 4. FIG. 4 is a perspective view showing an example of the structure of the memory cell MC. FIG. 4 focuses on a single memory cell MC in the memory cell array 110 to describe the configuration of the memory cells MC.

As illustrated in FIG. 4, the plate line PL is a plate-like interconnect having a portion extending along the XY plane. The memory cell MC is provided on the plate line PL. A contact plug VC is provided on the memory cell MC. The bit line BL is provided on the contact plug VC.

A cell transistor CT is a vertical transistor that includes a channel region extending along the Z direction. The cell transistor CT includes a semiconductor layer 10, a gate insulating layer 11, and a gate electrode 12. The semiconductor layer 10 is provided so as to extend in the Z direction. In other words, the semiconductor layer 10 has a columnar structure that extends in the Z direction. The gate electrode 12 faces the circumferential surface of the semiconductor layer 10, with a gate insulating layer 11 interposed. The gate insulating layer 11 is provided between the circumferential surface of the semiconductor layer 10 and the gate electrode 12. The channel region of the cell transistor CT is provided in the semiconductor layer 10. The semiconductor layer 10 may also be referred to as a semiconductor pillar or a channel pillar. The source region and drain region of the cell transistor CT are provided inside the semiconductor layer 10. Either one of the source region or drain region is provided in the upper portion of the semiconductor layer 10, while the other one of the drain region or source region is provided in the lower portion of the semiconductor layer 10.

The source region or drain region in the upper portion of the cell transistor CT may be coupled to the bit line BL via the contact plug VC. The drain region or source region in the lower portion of the cell transistor CT is coupled to the cell capacitor CC.

For the semiconductor layer 10 (channel material) of the cell transistor CT, an oxide semiconductor may be adopted. When the semiconductor layer 10 is an oxide semiconductor, the semiconductor layer 10 may include, for example, indium oxide, gallium oxide, and zinc oxide. Oxide semiconductors, which include indium oxide, gallium oxide, and zinc oxide, may be referred to as In—Ga—Zn oxide (IGZO). For the oxide semiconductor, an oxide containing at least one of indium, zinc, and tin (e.g., InO, InZnO, InSnO, SnO, ZnO, and ZnSnO) may also be adopted.

The cell transistor CT has a gate structure that is referred to as a gate-all-around (GAA) structure. In the cell transistor CT having a GAA structure, the gate electrode 12 entirely covers the circumferential surface of the channel region of the semiconductor layer 10. The gate electrode 12 circularly covers the circumferential surface of the channel region (along the Z direction) with the gate insulating layer 11 interposed. As a result, the cell transistor CT exhibits an excellent control force on the potential of the gate. The gate electrode 12 is coupled to a conductive layer 19 extending in the X direction. In this example, a pair of a gate electrode 12 and a conductive layer 19 corresponds to a word line WL. The gate electrode 12 and conductive layer 19 may form a boundary in between, or may be provided in continuity.

A cell capacitor CC includes two conductive layers 22 and 23 and an insulating layer 24. The insulating layer 24 is provided between two conductive layers 22 and 23. That is, the conductive layer 22 extends in the Z direction. A semiconductor layer 10 is coupled to the upper portion of the conductive layer 22. That is, the upper portion of the conductive layer 22 is coupled to the source region or drain region of the cell transistor CT. The side surface and lower portion of the conductive layer 22 is covered by the insulating layer 24. The side surface and lower portion of the insulating layer 24 is covered by the conductive layer 23. The bottom portion of the conductive layer 23 is coupled to the plate line PL. That is, the insulating layer 24 and conductive layer 23 are provided between the bottom portion of the conductive layer 22 and the plate line PL. The conductive layer 22 is therefore separated from the plate line PL. These two conductive layers 22 and 23 may also be referred to as capacitor electrodes, or simply as electrodes. The insulating layer 24 may also be referred to as a capacitor insulating layer. The insulating layer 24 may be configured so as to be in contact with the plate line PL, without a conductive layer 23 provided in the lower portion of the insulating layer 24.

As described above, the memory device 100 includes the memory cell array 110 having a three-dimensional structure. Each of the memory cells MC includes a vertical transistor as the cell transistor CT. The current path of the vertical transistor is along the Z direction. The cell transistor CT therefore passes the current in the Z direction. In addition, each of the memory cells MC includes a layer stack of the cell transistor CT and the cell capacitor CC. In this manner, the structure of the memory device 100 improves the integration of the memory cells MC and thereby improves the storage density of the memory cell array 110. For example, the memory device 100 can be formed with memory cells MC having a size of approximately 4F2.

1.5 Coupling Between Memory Cell Array 110 and Sense Circuits

Next, an example of coupling between the memory cell array 110 and each of the sense circuits will be described with reference to FIG. 5. FIG. 5 is a schematic diagram showing an example of coupling between the memory cell array 110 and the sense circuit SA. The example in FIG. 5 illustrates the sub-arrays 111_$i$ and 111_$i$+1 and the sense amplifier 133.

As illustrated in FIG. 5, for example, each of the sub-arrays 111_$i$ and 111_$i$+1 includes two bit lines BL0 and BL1, eight word lines WL0 to WL8, and a plurality of memory cells MC associated with these lines. Each of the memory cells MC is coupled between a word line WL and a bit line BL.

For example, the sense amplifier 133 includes a sense circuit SA0. The sense circuit SA0 is coupled to the bit line BL0 of the sub-array 111_$i$ and the bit line BL0 of the sub-array 111_$i$+1. For example, in a case where the word line WL3 of the sub-array 111_$i$ is selected (activated), the bit line BL0 of the sub-array 111_$i$ functions as a selected bit line BL0. The bit line BL0 of the sub-array 111_$i$+1 functions as a complementary bit line ⁻BL0. The sense circuit SA0 can amplify a voltage or current based on the bit line BL0 coupled to the selected sub-array 111_$i$ by using the bit line BL0 coupled to the unselected sub-array 111_$i$+1 as the complementary bit line ⁻BL. Hereinafter, such a scheme is referred to as an Open-BL scheme.

1.6 Circuit Configuration of Each Sense Circuit

Next, an example of a circuit configuration of each sense circuit SA will be described with reference to FIG. 6. FIG. 6 is a circuit diagram of the sense circuit SA.

As illustrated in FIG. 6, the sense circuit SA is coupled to a single bit line BL and a complementary bit line ⁻BL.

The sense circuit SA includes p-type MOSFETs TP1 and TP2 and n-type MOSFETs TN1 to TN6.

The transistor TP1 is coupled between a node SAP and a node SAt. For example, a voltage is applied to the node SAP from a voltage generation circuit. The node SAP is applied with one of a plurality of voltages including a power supply voltage Vddsa and a voltage Vddsa/2 that are dynamically switched. The power supply voltage Vddsa may have the same magnitude as the power supply voltage Vdd used in the memory device 100, or may have a magnitude different from the power supply voltage Vdd. The transistor TP1 is coupled to a node SAc at the gate of the transistor TP1. The transistor TP1 has an on-resistance of a certain magnitude while being turned on. The on-resistance of the transistor is a resistance while the transistor is on.

The transistor TN1 is coupled between the node SAt and a node SAN. For example, a voltage is applied to the node SAN from the voltage generation circuit. The node SAN is applied with one of a plurality of voltages including the power supply voltage Vddsa/2 and a ground voltage (common voltage) Vss that are dynamically switched. The ground voltage Vss is, for example, 0 V, and the following description is based on this example. The transistor TN1 is coupled to a single bit line BL at the gate of the transistor TN1. The transistor TN1 has an on-resistance of a certain magnitude.

The transistor TP2 is coupled between the node SAP and the node SAc. The transistor TP2 is coupled to the node SAt at the gate of the transistor TP2. The transistor TP2 has an on-resistance of substantially the same magnitude as the on-resistance of the transistor TP1.

The transistor TN2 is coupled between the node SAc and the node SAN. The transistor TN2 is coupled to the complementary bit line ⁻BL at the gate of the transistor TN2. The transistor TN2 has an on-resistance of substantially the same magnitude as the on-resistance of the transistor TN1.

The transistor TN3 is coupled between the node SAt and the gate of the transistor TN1. The transistor TN3 receives a signal OC at the gate of the transistor TN3. The signal OC is supplied from, for example, the read/write circuit 140.

The transistor TN4 is coupled between the node SAc and the gate of the transistor TN2. The transistor TN4 receives the signal OC at the gate of the transistor TN4.

The transistor TN5 is coupled between the node SAt and the complementary bit line ⁻BL. The transistor TN5 receives a signal ISO at the gate of the transistor TN5. The signal ISO is supplied from, for example, the read/write circuit 140. The transistor TN5 has, for example, substantially the same dimensions as the dimensions of the transistor TN3. In this example, the parasitic capacitance of one of the source and the drain of the transistor TN5 and the gate of the transistor TN5 is substantially the same as the parasitic capacitance of one of the source and the drain of the transistor TN3 and the gate of the transistor TN3.

The transistor TN6 is coupled between the node SAc and the bit line BL. The transistor TN6 receives the signal ISO at the gate of the transistor TN6. The transistor TN6 has, for example, substantially the same dimensions as the dimensions of the transistor TN4. In this example, the parasitic capacitance of one of the source and the drain of the transistor TN6 and the gate of the transistor TN6 is substantially the same as the parasitic capacitance of one of the source and the drain of the transistor TN4 and the gate of the transistor TN4.

The transistors TP1 and TN1 constitute an inverter circuit IV1, and the transistors TP2 and TN2 constitute an inverter circuit IV2. While the transistors TN5 and TN6 are turned on, the inverter circuit IV1 and the inverter circuit IV2 are so-called cross-coupled. That is, the input node and the output node of the inverter circuit IV1 are coupled to the output node and the input node of the inverter circuit IV2, respectively.

1.7 Layout of Bit Lines in Memory Cell Array

Next, an example of a layout of the bit lines BL in the memory cell array 110 will be described with reference to FIGS. 7 and 8. FIG. 7 is a diagram showing the layout of the bit lines BL. FIG. 8 is an enlarged view of a region EV1 illustrated in FIG. 7. The example in FIG. 7 illustrates the layout of the bit lines BL as viewed from the semiconductor substrate SUB side. The example in FIG. 8 illustrates a layout of the sense circuits SA, the pads BP, and the bit lines BL as viewed from the semiconductor substrate SUB side. In the following description, hatching is appropriately added to the plan views as appropriate. These hatch patterns, however, may not relate to the materials or properties of the hatch-patterned structural components. The components may be suitably omitted from the illustration of the configuration in the drawings. Furthermore, in the following description, in a case of describing the arrangement in a single direction such as a plurality of objects that are "arranged side by side in the Y direction", the arrangement of the plurality of objects in other directions (the X direction and the Z direction) is not limited. The plurality of objects may not be arranged side by side in the X direction and the Z direction.

As illustrated in FIG. 7, the plurality of sub-arrays 111 are arranged side by side in the Y direction. In the example illustrated in FIG. 7, the sub-arrays 111_$i$, 111_$i$+1, 111_$i$+2, 111_$i$+3, 111_$i$+4, and 111_$i$+5 are arranged side by side in this order from the upper side of the page of FIG. 7.

The plurality of bit lines BL are arranged side by side in the X direction. The bit lines BL extend in the Y direction. Each bit line BL is divided into a plurality of bit lines in the Y direction. Hereinafter, each of the bit lines BL divided in the Y direction is also referred to as a "divided bit line BL". The lengths of the divided bit lines BL are substantially the same. In the present embodiment, positions where the bit lines BL are divided are different in the Y direction. The position where at least one of the bit lines BL is divided is in a region between the adjacent sub-arrays 111. Each of the bit lines BL divided in the Y direction is coupled to different sub-arrays 111. In the example illustrated in FIG. 7, the positions where the plurality of bit lines BL are divided are different every two. Each of the bit lines BL divided in the Y direction is commonly coupled to four sub-arrays 111. The number of the bit lines BL divided at the same position may be every one or every three or more.

More specifically, the bit lines BL0 and BL1 are divided between the sub-arrays 111_$i$ and 111_$i$+1 and between the sub-arrays 111_$i$+4 and 111_$i$+5. For example, one of the divided bit lines BL0 and one of the divided bit lines BL1 are coupled to the four sub-arrays 111_$i$+1, 111_$i$+2, 111_$i$+3, and 111_$i$+4. The bit lines BL2 and BL3 are divided between the sub-arrays 111_$i$+1 and 111_$i$+2. For example, one of the divided bit lines BL2 and one of the divided bit lines BL3 are coupled to the four sub-arrays 111_$i$+2, 111_$i$+3, 111_$i$+4, and 111_$i$+5. The bit lines BL4 and BL5 are divided between the sub-arrays 111_$i$+2 and 111_$i$+3. The bit lines BL6 and BL7 are divided between the sub-arrays 111_$i$+3 and 111_$i$+4. For the bit lines BL8 and the subsequent bit lines, the patterns of the bit lines BL0 to BL7 are repeated.

In the present embodiment, two divided bit lines BL adjacent to each other in the Y direction are coupled to a single sense circuit SA. In the example illustrated in FIG. 7, the word line WL of the sub-array 111_$i$ is selected. In this case, the sub-array 111_$i$ is the selected sub-array 111_$i$. For example, the selected bit line BL0 coupled to the selected sub-array 111_$i$ and the complementary bit line ⁻BL0 coupled to the unselected sub-array 111_$i$+1 to 111_$i$+4 are coupled to a single sense circuit SA. A contact plug CP1 is provided on each divided bit line BL. The divided bit line BL is electrically coupled to the sense circuit SA via the contact plug CP1. Two contact plugs CP1 electrically coupled to a single sense circuit SA are arranged in the vicinity of ends of two divided bit lines BL facing each other in the Y direction.

For example, positions where the two bit lines BL divided at the same position and adjacent in the X direction are coupled to the contact plugs CP1 are different from each other in the Y direction. More specifically, for example, the divided bit line BL0 of the sub-array 111_$i$+1 to 111_$i$+4 is coupled to the contact plug CP1 in the sub-array 111_$i$+1. In addition, the divided bit line BL1 of the sub-array 111_$i$+1 to 111_$i$+4 is coupled to the contact plug CP1 in the sub-array 111_$i$+4.

Next, a description will be given focusing on the positions where the bit lines BL are divided, and the arrangement of the pads BP coupled to the bit lines BL, and the sense circuits SA.

As illustrated in FIG. 8, the pads BP and ⁻BP are arranged in the vicinity of ends of the selected bit line BL and the complementary bit line $^-$BL facing each other in the Y direction. That is, the pad BP (or the pad $^-$BP) is arranged above the contact plug CP1. The sense circuits SA are arranged at the positions where the bit lines BL are divided in the Y direction. In other words, each of the sense circuits SA is arranged between two pads BP and $^-$BP coupled to two associated bit lines BL and $^-$BL, respectively, in the Y direction.

More specifically, the bit line BL0 coupled to the selected sub-array 111_$i$ is electrically coupled to the pad BP0 via the contact plug CP1 above the end of the sub-array 111_$i$ facing the sub-array 111_$i$+1. On the other hand, the bit line BL0 (complementary bit line $^-$BL0) coupled to the unselected sub-arrays 111 (including the sub-arrays 111_$i$+1 to 111_$i$+4) is coupled to the pad $^-$BP0 via the contact plug CP1 above the end of the sub-array 111_$i$+1 facing the sub-array 111_$i$. In the Y direction, the sense circuit SA0 is arranged (intermediate) between the pad BP0 and the pad $^-$BP0. The pads BP0 and $^-$BP0 are coupled to the sense circuit SA0. In the example illustrated in FIG. 8, the sizes of the pads BP and the sense circuits SA are sufficiently larger than a pitch between the bit lines BL. Therefore, for example, the pads BP8 and $^-$BP8 coupled to the bit line BL8, and the sense circuit SA8 are respective arranged adjacent to the pads BP0 and $^-$BP0, and the sense circuit SA0 in the X direction. Note that the arrangement of the pads BP and the sense circuits SA adjacent to each other in the X direction is arbitrary. The arrangement of the bit line BL8, the pads BP8 and $^-$BP8, and the sense circuit SA8 is similar to that of the bit line BL0, the pads BP0 and $^-$BP0, and the sense circuit SA0. The sense circuit SA0 and the sense circuit SA8 are arranged side by side in the X direction in a region between the sub-array 111_$i$ and the sub-array 111_$i$+1. A partial region of each of the pads BP and a partial region of each of the sense circuits SA may overlap in the Y direction.

The bit line BL2 coupled to the selected sub-array 111_$i$ is electrically coupled to the pad BP2 via the contact plug CP1 above the end of the sub-array 111_$i$+1 facing the sub-array 111_$i$+2. On the other hand, the bit line BL2 (complementary bit line $^-$BL2) coupled to the unselected sub-arrays 111 (including the sub-arrays 111_$i$+2 to 111_$i$+3) is coupled to the pad $^-$BP2 via the contact plug CP1 above the end of the sub-array 111_$i$+2 facing the sub-array 111_$i$+1. In the Y direction, the sense circuit SA2 is arranged between the pad BP2 and the pad $^-$BP2. The pads BP2 and $^-$BP2 are coupled to the sense circuit SA2. The arrangement of the bit line BL10, the pads BP10 and $^-$BP10, and the sense circuit SA10 is similar to the above-described arrangement. The sense circuit SA2 and the sense circuit SA10 are arranged side by side in the X direction in a region between the sub-array 111_$i$+1 and the sub-array 111_$i$+2.

The bit line BL4 coupled to the selected sub-array 111_$i$ is electrically coupled to the pad BP4 via the contact plug CP1 above the end of the sub-array 111_$i$+2 facing the sub-array 111_$i$+3. On the other hand, the bit line BL4 (complementary bit line $^-$BL4) coupled to the unselected sub-arrays 111 (including the sub-array 111_$i$+3) is coupled to the pad $^-$BP4 via the contact plug CP1 above the end of the sub-array 111_$i$+3 facing the sub-array 111_$i$+2. In the Y direction, the sense circuit SA4 is arranged between the pad BP4 and the pad $^-$BP4. The pads BP4 and $^-$BP4 are coupled to the sense circuit SA4. The arrangement of the bit line BL12, the pads BP12 and $^-$BP12, and the sense circuit SA12 is similar to the above-described arrangement. The sense circuit SA4 and the sense circuit SA12 are arranged side by side in the X direction in a region between the sub-array 111_$i$+2 and the sub-array 111_$i$+3.

1.8 Cross-Sectional Configuration of Memory Cell Array

Next, an example of a cross-sectional structure of the memory cell array 110 will be described with reference to FIG. 9. FIG. 9 is a cross-sectional view of the memory device 100 taken along line A1-A2 in FIG. 8. The example in FIG. 9 illustrates the sub-arrays 111_$i$ and 111_$i$+1 and the transistors TN5 and TN6 of the sense circuit SA0.

First, the circuit chip 2000 will be described.

As illustrated in FIG. 9, the circuit chip 2000 includes the transistors TN5 and TN6 of the sense circuit SA0, a plurality of contact plugs CPA and CPB, a plurality of interconnects M0, and a plurality of pads BPc.

The transistors TN5 and TN6 are provided corresponding to active regions AA1 and AA2 formed in the semiconductor substrate SUB, respectively. Each of the active regions AA1 and AA2 is surrounded by shallow trench isolation (STI). Each of the active regions AA1 and AA2 includes a well region 30 provided in the semiconductor substrate SUB.

In addition, each of the transistors TN5 and TN6 includes a gate electrode 31, a gate insulating layer 32, and two source/drain regions 33A and 33B. The gate electrode 31 is provided above the well region 30 in the Z1 direction. The gate insulating layer 32 is provided between the top surface of the well region 30 and the gate electrode 31. The two source/drain regions 33A and 33B are provided in the well region 30. One of the two source/drain regions 33A and 33B functions as the source of the transistor TN, and the other of the two source/drain regions 33A and 33B functions as the drain of the transistor TN. A portion between the two source/drain regions 33A and 33B in the well region 30 serves as a channel region of the transistor TN. The channel region is arranged underneath the gate electrode 31 with the gate insulating layer 32 interposed. Each transistor TN is covered with an interlayer insulating layer 40 on the semiconductor substrate SUB.

Each contact plug CPA is a columnar conductor provided on the semiconductor substrate SUB and coupled to the transistor TN or the like. Each interconnect M0 is a conductor arranged on the associated contact plug CPA and made of, for example, a metal. Each contact plug CPB is a columnar conductor provided on the associated interconnect M0. Each pad BPc is a conductor provided on the associated contact plug CPB, and is made of, for example, a metal. Each pad BPc is provided such that a surface of the pad BPc is exposed to the bonding surface.

Next, a configuration of the array chip 1000 will be described. The array chip 1000 includes the sub-arrays 111_$i$ and 111_$i$+1 included in the memory cell array 110, the plurality of contact plugs CP1, and the plurality of pads BPm.

Each sub-array 111 is covered with an interlayer insulating layer 41. Each sub-array 111 includes the plate line PL, a plurality of memory cells MC, a plurality of word lines WL, and a plurality of bit lines BL.

The plate line PL is a plate-like conductor and is formed of a metal, for example. The plate line PL may also be referred to as a plate electrode or plate layer. The plurality of memory cells MC are arranged on a surface of the plate line PL facing the Z2 direction. Each of the memory cells MC extends in the Z2 direction. The capacitor CC and the cell transistor CT (vertical transistor) are sequentially provided from the plate line PL toward the Z2 direction. The semiconductor layer 10 of the cell transistor CT penetrates the associated word line WL. The word line WL extends in the X direction. The word line WL is provided in a layer between a layer provided with the plate line PL and a layer provided with the contact plug VC. In the Z2 direction, the contact plug VC is provided on the cell transistor CT. In the Z2 direction, the bit line BL is provided on the contact plug VC. The contact plug VC couples the cell transistor CT, that is, the memory cell MC to the bit line BL.

In the Z2 direction, the contact plug CP1 is provided on the bit line BL. Each contact plug CP1 is a columnar conductor provided on the associated bit line BL. Each pad BPm is a conductor provided on the associated contact plug CP1 in the Z2 direction, and is made of, for example, a metal. Each pad BPm is provided such that a surface of the pad BPm is exposed to the bonding surface and faces the pad BPc. A pair of the pads BPm and BPc forms the pad BP.

For example, a length of a current path from the pad BP0, to which the bit line BL0 of the sub-array 111_$i$ is coupled, to the transistor TN6 of the sense circuit SA0 is L1. That is, the length of the current path coupling the pad BP0 to the source/drain region 33A of the transistor TN6 via the contact plug CPB, the interconnect M0, and the contact plug CPA is L1. In addition, a length of a current path from the pad ⁻BP0 to which the bit line ⁻BL0 of the sub-array 111_$i$+1 is coupled to the transistor TN5 of the sense circuit SA0 is L2. That is, the length of the current path coupling the pad ⁻BP0 to the source/drain region 33B of the transistor TN5 via the contact plug CPB, the interconnect M0, and the contact plug CPA is L2. The length L1 and the length L2 of the current paths have a relationship of L1=L2.

1.9 Effects According to Present Embodiment

With the configuration according to the present embodiment, it is possible to provide the memory device that can improve reliability. This effect will be described in detail.

For example, in the read operation of the memory device, the sense circuit SA amplifies the voltage difference between the selected bit line BL and the complementary bit line ⁻BL. In this case, in a case where a length of a current path from the selected bit line BL to the sense circuit SA is different from a length of a current path from the complementary bit line ⁻BL to the sense circuit SA, the resistance value and the interconnect parasitic capacitance of one of the current paths are different from those of the other of the current paths. That is, CR time constants are different. The difference in CR time constant causes a difference in the transmission speed (delay amount) of signals (voltages or currents) received by the sense circuit SA from the selected bit line BL and the complementary bit line ⁻BL. Therefore, there is a high possibility of malfunction (erroneous reading) due to a difference in signal reception timing in the sense circuit SA. The same applies to the write operation.

On the other hand, with the configuration according to the present embodiment, in the memory device 100 having the bonding structure, the length La of the selected bit line BL and the length Lb of the complementary bit line ⁻BL can be substantially the same. Furthermore, the length L1 of the current path from the pad BP coupled to the selected bit line BL to the sense circuit SA and the length L2 of the current path from the pad ⁻BP coupled to the complementary bit line ⁻BL to the sense circuit SA can be substantially the same. As a result, in the sense circuit SA, it is possible to suppress a difference in signal reception timing due to the difference in CR time constant. Therefore, malfunction in the read operation and the write operation can be suppressed. Therefore, the reliability of the memory device 100 can be improved.

More specifically, with the configuration according to the present embodiment, the plurality of sub-arrays 111 can be arranged side by side in the Y direction in the memory device 100. In the Y direction, each sense amplifier 133 can be arranged between two adjacent sub-arrays 111. Furthermore, each sense circuit SA can be arranged between two pads BP and ⁻BP coupled to the sense circuit SA in the Y direction. That is, the distance from the sense circuit SA to the one pad BP and the distance from the sense circuit SA to the other pad ⁻BP can be made substantially the same. As a result, the length L1 and the length L2 of the current paths can be made substantially the same.

Furthermore, with the configuration according to the present embodiment, the bit lines BL extending in the Y direction can be divided at positions different for each bit line BL. By distributing the division positions, the pads BP and the sense circuits SA can be distributed and arranged. Then, the number of sense circuits SA arranged in one of the regions between the sub-arrays 111 can be reduced. As a result, the plurality of sense circuits SA can be arranged in a row in the X direction. Therefore, the sense circuits SA can be arranged at intermediate positions between the pads BP and ⁻BP. Therefore, the length L1 and the length L2 of the current paths can be made substantially the same.

Furthermore, with the configuration according to the present embodiment, the pad BP, the sense circuit SA, and the pad ⁻BP can be arranged side by side in the Y direction. As a result, the length L1 and the length L2 of the current paths can be minimized. Therefore, an increase in the CR time constant can be suppressed, and a signal delay can be suppressed. Therefore, the processing capability of the memory device 100 can be improved.

1.10 Modification Examples of First Embodiment

Next, as modification examples of the first embodiment, two examples of a structure of the memory device 100 different from the bonding structure will be described.

1.10.1 First Modification Example

First, as a first modification example of the first embodiment, a case where the memory cell array 110 and the sense amplifiers 133 are arranged side by side on the semiconductor substrate SUB will be described. Differences from the first embodiment will be mainly described.

1.10.1.1 Arrangement of Sub-Arrays and Sense Amplifiers

First, an example of the arrangement of the sub-arrays 111 and the sense amplifiers 133 will be described with reference to FIGS. 10 and 11. FIG. 10 is a perspective view of the memory device 100, showing an example of the arrangement of the sub-arrays 111 and the sense amplifiers 133. FIG. 11 is a cross-sectional view of the memory device 100, showing the example of the arrangement of the sub-arrays 111 and the sense amplifiers 133. In the example illustrated in FIGS. 10 and 11, the semiconductor substrate SUB, the sub-arrays 111, and the sense amplifiers 133 are illustrated, and the other components are omitted in order to simplify the description.

As illustrated in FIGS. 10 and 11, the memory device 100 according to the present example includes the plurality of sub-arrays 111 and the plurality of sense amplifiers 133 provided on the semiconductor substrate SUB. In the example illustrated in FIGS. 10 and 11, the four sub-arrays 111_$i$−1, 111_$i$, 111_$i$+1, and 111_$i$+2 are illustrated. The sub-arrays 111 and the sense amplifiers 133 are alternately arranged one by one in the Y direction. That is, each of the sense amplifiers 133 is arranged between two adjacent sub-arrays 111 in the Y direction. Each of the sense amplifiers 133 includes a plurality of sense circuits SA arranged in a line in the X direction.

As in the first embodiment, each bit line BL is coupled to a plurality of sub-arrays 111. For example, the bit lines BL extend in the Y direction. In the example illustrated in FIGS. 10 and 11, the selected bit line BL coupled to the sub-arrays 111_$i$-1 and 111_$i$ and the complementary bit line ⁻BL coupled to the sub-arrays 111_$i$+1 and 111_$i$+2 are illustrated. The lengths of the selected bit line BL and the complementary bit line ⁻BL are substantially the same.

For example, each of the selected bit line BL and the complementary bit line ⁻BL is coupled to the sense circuit SA arranged between the sub-array 111_$i$ and the sub-array 111_$i$+1 via the contact plug CP1. That is, the selected bit line BL and the complementary bit line ⁻BL are coupled to the sense circuit SA arranged between the sub-array 111 to which the selected bit line BL is coupled and the sub-array 111 to which the complementary bit line ⁻BL is coupled.

As illustrated in FIG. 11, in the memory device 100 according to the present example, a length of a current path (including a plurality of interconnects and contact plugs) from the selected bit line BL to the sense circuit SA is L3. In addition, a length of a current path from the complementary bit line ⁻BL to the sense circuit SA is L4. The length L3 and the length L4 of the current paths are substantially the same.

1.10.1.2 Layout of Bit Lines in Memory Cell Array

Next, an example of a layout of the bit lines BL in the memory cell array 110 will be described with reference to FIG. 12. FIG. 12 is a diagram showing the layout of the bit lines BL.

As illustrated in FIG. 12, the plurality of sub-arrays 111 and the sense amplifiers 133 are alternately arranged side by side in the Y direction. In each of the sense amplifiers 133, a plurality of sense circuits SA are arranged in a row in the X direction. In the example illustrated in FIG. 12, the sub-arrays 111_$i$-1, 111_$i$, 111_$i$+1, 111_$i$+2, 111_$i$+3, 111_$i$+4, and 111_$i$+5 are arranged side by side in this order from the upper side of the page of FIG. 12. Three sense circuits SA arranged side by side in the X direction are provided between the sub-arrays 111.

The plurality of bit lines BL are arranged side by side in the X direction. The bit lines BL extend in the Y direction. Each of the bit lines BL is divided into bit lines having lengths that are substantially the same in the Y direction. In the example illustrated in FIG. 12, each of the bit lines BL divided in the Y direction is commonly coupled to two sub-arrays 111. Positions where the bit lines BL are divided are different for each bit line BL. Therefore, the bit lines BL adjacent in the X direction are coupled to the sense circuits SA of the different sense amplifiers 133 arranged in the region between the different sub-arrays 111 in the Y direction. Therefore, since the current paths (the contact plugs CP1 and the interconnects) of the bit lines BL adjacent in the X direction are located at positions relatively distant from each other via the sub-arrays 111, an increase in the CR time constants in the current paths can be suppressed.

1.10.1.3 Effects According to First Modification Example

With the configuration according to the first modification example, it is possible to provide the memory device that can improve reliability as in the first embodiment. More specifically, similarly to the first embodiment, the length of the selected bit line BL and the length of the complementary bit line ⁻BL can be substantially the same. Furthermore, the length L3 of the current path from the selected bit line BL to the sense circuit SA and the length L4 of the current path from the complementary bit line ⁻BL to the sense circuit SA can be substantially the same. Therefore, in the sense circuit SA, it is possible to suppress a difference in signal reception timing due to a difference in CR time constant. Therefore, malfunction in the read operation and the write operation can be suppressed. Therefore, the reliability of the memory device 100 can be improved.

More specifically, with the configuration according to the first modification example, in the memory device 100, the plurality of sub-arrays 111 and the sense amplifiers 133 (sense circuits SA) can be alternately arranged in the Y direction. Furthermore, in the Y direction, each of the sense circuits SA can be arranged between the sub-array 111 including one bit line BL coupled to the sense circuit SA and the sub-array 111 including the other bit line BL coupled to the sense circuit SA. Furthermore, a plurality of sense circuits SA can be arranged side by side in the X direction between two sub-arrays 111. As a result, the length L3 and the length L4 of the current paths can be substantially the same.

For example, in a case where two sense circuits SA corresponding to two bit lines BL adjacent in the X direction are arranged in one of the regions between the sub-arrays 111, the distance between the contact plugs CP1 coupled to the adjacent bit lines BL becomes relatively short. Therefore, the CR time constant increases due to the effect of the parasitic capacitance between the contact plugs CP1, and the signal transmission speed decreases. For example, in order to reduce the parasitic capacitance between the contact plugs CP1, that is, to increase the distance between the contact plugs CP1, a formation region of the contact plugs CP1 having a relatively large area may be provided between the sub-arrays 111 and the sense circuits SA (sense amplifiers 133).

On the other hand, in the configuration according to the first modification example, the bit lines BL arranged side by side in the X direction can be coupled to the sense circuits SA of the different sense amplifiers 133 arranged in the region between the different sub-arrays 111 in the Y direction. Therefore, the contact plugs CP1 coupled to the adjacent bit lines BL can be arranged relatively apart via the sub-arrays 111. As a result, the parasitic capacitance between the contact plugs CP1 can be reduced. That is, signal delay due to an increase in CR time constant can be reduced. Therefore, it is possible to suppress a decrease in the processing capability of the memory device 100. Furthermore, it is possible to suppress an increase in the area of the formation region of the contact plugs CP1 provided between the sub-arrays 111 and the sense circuits SA (sense amplifiers 133). Therefore, an increase in the chip area of the memory device 100 can be suppressed.

1.10.2 Second Modification Example

Next, as a second modification example of the first embodiment, a case where the memory cell array 110 is stacked above the sense amplifiers 133 provided on the semiconductor substrate SUB will be described. Differences from the first embodiment and the first modification example of the first embodiment will be mainly described.

1.10.2.1 Arrangement of Sub-Arrays and Sense Amplifiers

Figure 13:
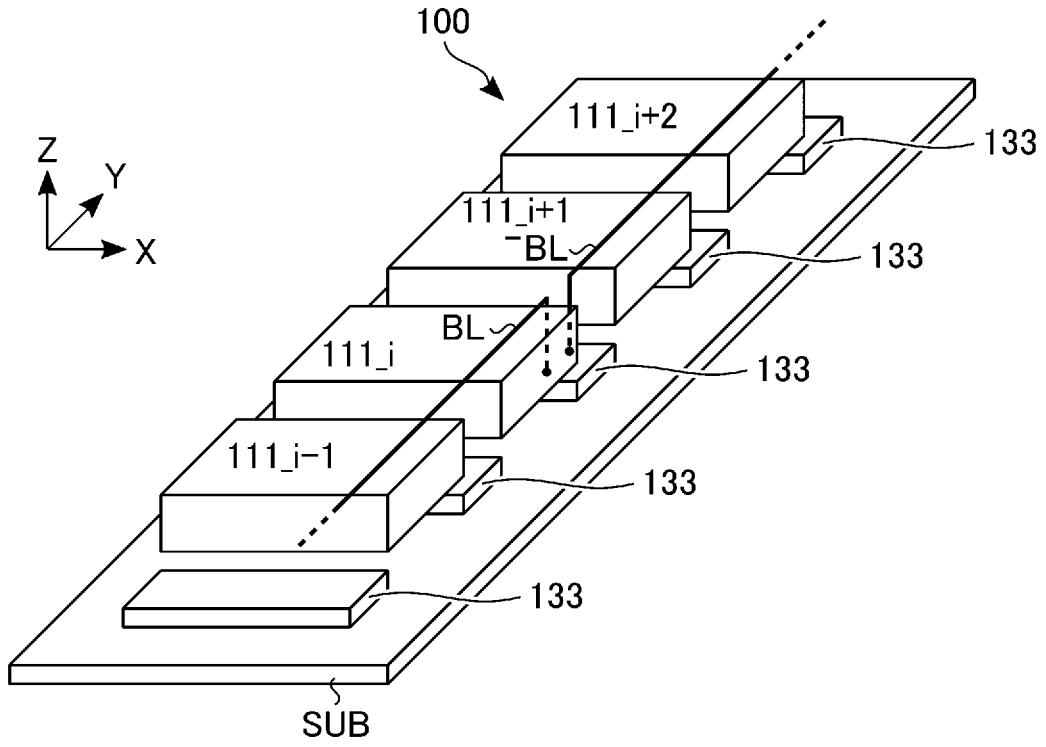
FIG. 13 is a perspective view showing an example of the arrangement of the sub-arrays and the sense amplifiers included in the memory device according to the second modification example of the first embodiment.

First, an example of the arrangement of the sub-arrays 111 and the sense amplifiers 133 will be described with reference to FIGS. 13 and 14. FIG. 13 is a perspective view of the memory device 100, showing an example of the arrangement of the sub-arrays 111 and the sense amplifiers 133. FIG. 14 is a cross-sectional view of the memory device 100, showing the example of the arrangement of the sub-arrays 111 and the sense amplifiers 133. In the example illustrated in FIGS. 13 and 14, the semiconductor substrate SUB, the sub-arrays 111, and the sense amplifiers 133 are illustrated, and the other components are omitted in order to simplify the description.

As illustrated in FIGS. 13 and 14, the memory device 100 according to the present example includes the plurality of sense amplifiers 133 provided on the semiconductor substrate SUB and the plurality of sub-arrays 111 provided above the sense amplifiers 133. In the examples illustrated in FIGS. 13 and 14, the four sub-arrays 111_$i$–1, 111_$i$, 111_$i$+1, and 111_$i$+2 are illustrated. The plurality of sub-arrays 111 and the plurality of sense amplifiers 133 are alternately arranged one by one in the Y direction. That is, each of the sense amplifiers 133 is arranged between two adjacent sub-arrays 111 in the Y direction. Also in the present structure, similarly to the first embodiment, the positions of the sub-arrays 111 are different from the positions of the sense amplifiers 133 in the Z direction. Therefore, a part of the region of each of the sub-arrays 111 and a part of the region of each of the sense amplifiers 133 may overlap in the Y direction.

As in the first embodiment, each bit line BL is coupled to a plurality of sub-arrays 111. For example, the bit lines BL extend in the Y direction. In the examples illustrated in FIGS. 13 and 14, the selected bit line BL coupled to the sub-arrays 111_$i$–1 and 111_$i$ and the complementary bit lines ⁻BL coupled to the sub-arrays 111_$i$+1 and 111_$i$+2 are illustrated. The lengths of the selected bit line BL and the complementary bit line ⁻BL are substantially the same.

Each of the sense amplifiers 133 includes a plurality of sense circuits SA arranged in a line in the X direction.

For example, each of the selected bit line BL and the complementary bit line ⁻BL is coupled to the sense circuit SA arranged between the sub-array 111_$i$ and the sub-array 111_$i$+1 in the Y direction. In other words, the selected bit line BL and the complementary bit line ⁻BL are coupled to the sense circuit SA arranged between the sub-array 111 to which the selected bit line BL is coupled and the sub-array 111 to which the complementary bit line ⁻BL is coupled.

As illustrated in FIG. 14, in the memory device 100 according to the present example, a length of a current path (including a plurality of interconnects and contact plugs) from the selected bit line BL to the sense circuit SA is L5. In addition, a length of a current path from the complementary bit line ⁻BL to the sense circuit SA is L6. The length L5 and the length L6 of the current paths are substantially the same.

1.10.2.2 Cross-Sectional Configuration of Memory Cell Array

Next, an example of a cross-sectional structure of the memory cell array 110 will be described with reference to FIG. 15. FIG. 15 is a cross-sectional view of the memory device 100. The example in FIG. 15 illustrates the sub-arrays 111_$i$ and 111_$i$+1 and the transistors TN5 and TN6 of the sense circuit SA0.

As illustrated in FIG. 15, the memory device 100 includes the transistors TN5 and TN6 of the sense circuit SA0, a plurality of contact plugs CPA and CPB, a plurality of interconnects M0 and M1, the sub-arrays 111_$i$ and 111_$i$+1 included in the memory cell array 110, and a plurality of contact plugs CP1.

The configurations of the transistors TN5 and TN6, the contact plugs CPA and CPB, and the interconnects M0 are similar to those in FIG. 9 described in the first embodiment. The interconnects M1 are conductors provided on the associated contact plugs CPB, and are made of, for example, a metal.

In each sub-array 111 according to the present embodiment, the plate line PL is provided above the semiconductor substrate SUB. The plurality of memory cells MC are arranged on a surface of the plate line PL facing the Z1 direction. Each of the memory cells MC extends in the Z direction. The capacitor CC and the cell transistor CT (vertical transistor) are sequentially provided from the plate line PL toward the Z1 direction. The semiconductor layer 10 of the cell transistor CT penetrates the associated word line WL. The word line WL extends in the X direction. The word line WL is provided in a layer between the layer provided with the plate line PL and the layer provided with the bit line BL.

The contact plug CP1 is provided on the interconnect M1 side by side with the cell transistor CT in the Y direction. The contact plug CP1 couples the interconnect M1 to the bit line BL.

For example, the length of the current path from the bit line BL0 of the sub-array 111_$i$ to the transistor TN6 of the sense circuit SA0 is L5. That is, the length of the current path coupling the bit line BL0 to the source/drain region 33A of the transistor TN6 via the contact plug CP1, the interconnect M1, the contact plug CPB, the interconnect M0, and the contact plug CPA is L5. In addition, the length of the current path from the bit line ⁻BL0 of the sub-array 111_$i$+1 to the transistor TN5 of the sense circuit SA0 is L6. That is, the length of the current path coupling the complementary bit line ⁻BL0 to the source/drain region 33B of the transistor TN5 via the contact plug CP1, the interconnect M1, the contact plug CPB, the interconnect M0, and the contact plug CPA is L6. The length L5 and the length L6 of the current paths have a relationship of L5=L6.

1.10.2.3 Effects According to Second Modification Example

With the configuration according to the second modification example, effects similar to those obtained in the first embodiment can be obtained.

2. Second Embodiment

Next, a second embodiment will be described. In the second embodiment, three examples of arrangement of pads BP and sense circuits SA different from those described in the first embodiment will be described. Differences from the first embodiment will be mainly described.

2.1 First Example

First, a first example of the second embodiment will be described. In the present example, a case where the arrangement of the pads BP and the sense circuits SA is shifted in the X direction from above associated bit lines BL will be described.

2.1.1 Layout of Bit Lines, Pads BP, and Sense Circuits

An example of a layout of the bit lines BL, the pads BP, and the sense circuits SA will be described with reference to FIG. 16. FIG. 16 is a diagram showing the layout of the sense circuits SA, the pads BP, and the bit lines BL as viewed from the semiconductor substrate SUB side.

As illustrated in FIG. 16, in this example, positions where the plurality of bit lines BL arranged side by side in the X direction are divided are different every four bit lines BL. For example, bit lines BL0 to BL3 are divided between a sub-array 111_$i$ and a sub-array 111_$i$+1. For example, bit lines BL4 to BL7 are divided between the sub-array 111_$i$+1 and a sub-array 111_$i$+2. For example, bit lines BL8 to BL11 are divided between the sub-array 111_$i$+2 and a sub-array 111_$i$+3.

For example, in a case where the sense circuit SA0 and the sense circuit SA2 are arranged in the same region between the same sub-arrays 111 (between the sub-array 111_$i$ and the sub-array 111_$i$+1), when it is attempted to arrange the pads BP2 and ⁻BP2 and the sense circuit SA2 above the bit line BL2, the pads BP2 and ⁻BP2 and the sense circuit SA2 overlap the pads BP0 and ⁻BP0 and the sense circuit SA0. Therefore, the pads BP2 and ⁻BP2 and the sense circuit SA2 cannot be arranged above the bit line BL2. In such a case, for example, the pads BP2 and ⁻BP2 and the sense circuit SA2 are shifted in the X direction. That is, the pads BP2 and ⁻BP2 and the sense circuit SA2 are shifted in the direction (X direction) perpendicular to the longitudinal direction (Y direction) of the bit line BL. Then, current paths coupling the bit lines BL to the pads BP are drawn in a direction perpendicular to the longitudinal direction of the bit lines BL. More specifically, the selected bit line BL2 and the pad BP2 are electrically coupled to each other via an interconnect M1 extending in the X direction. Similarly, the complementary bit line ⁻BL2 and the pad ⁻BP2 are electrically coupled to each other via an interconnect M1 extending in the X direction. Similarly, to the sense circuit SA0, the sense circuit SA2 is arranged (intermediate) between the pad BP2 and the pad ⁻BP2 in the Y direction. The sense circuit SA0 and the sense circuit SA2 are arranged side by side in the X direction. As a result, for example, the length of the current path from the pad BP2 to the sense circuit SA2 and the length of the current path from the pad ⁻BP2 to the sense circuit SA2 can be substantially the same. Note that, in the example illustrated in FIG. 16, the pads BP2 and ⁻BP2 and the sense circuit SA2 are shifted in the X direction, but a set of the pads BP and ⁻BP and the sense circuit SA to be shifted in the X direction can be arbitrarily designed. For example, the pads BP0 and ⁻BP0 and the sense circuit SA0 may be shifted in the X direction. In addition, both a set of the pads BP0 and ⁻BP0 and the sense circuit SA0 and a set of the pads BP2 and ⁻BP2 and the sense circuit SA2 may be shifted in the X direction. In this case, a length of an interconnect M1 coupled to the bit line BL0 and a length of the interconnect M1 coupled to the bit line BL2 may be substantially the same. In addition, a length of an interconnect M1 coupled to the bit line ⁻BL0 and a length of the interconnect M1 coupled to the bit line ⁻BL2 may be substantially the same.

Similarly, for example, in a case where the sense circuit SA4 and the sense circuit SA6 are arranged in the same region between the sub-arrays 111 (between the sub-array

111_$i$+1 and the sub-array 111_$i$+2), the pads BP6 and ⁻BP6 and the sense circuit SA6 are shifted in the X direction. The selected bit line BL6 and the pad BP6 are electrically coupled to each other via an interconnect M1 extending in the X direction. Similarly, the complementary bit line ⁻BL6 and the pad ⁻BP6 are electrically coupled to each other via an interconnect M1 extending in the X direction.

For example, in a case where the sense circuit SA8 and the sense circuit SA10 are arranged in the same region between the sub-arrays 111 (between the sub-array 111_$i$+2 and the sub-array 111_$i$+3), the pads BP10 and ⁻BP10 and the sense circuit SA10 are shifted in the X direction. The selected bit line BL10 and the pad BP10 are electrically coupled to each other via an interconnect M1 extending in the X direction. Similarly, the complementary bit line ⁻BL10 and the pad ⁻BP10 are electrically coupled to each other via an interconnect M1 extending in the X direction.

2.1.2 Coupling Between Bit Lines and Pads BP

Next, an example of coupling between the bit lines BL and the pads BP will be described with reference to FIG. 17. FIG. 17 is a perspective view showing the bit lines BL and the pads BP. The example in FIG. 17 illustrates the bit lines BL0 to BL2, a plurality of contact plugs CP1, the plurality of interconnects M1, a plurality of contact plugs CP2, and the pads BP0, ⁻BP0, BP2, and ⁻BP2.

As illustrated in FIG. 17, the pads BP0 and ⁻BP0 are arranged above the corresponding bit lines BL0. More specifically, the contact plugs CP1 are provided on the bit lines BL0 in the 22 direction. The interconnects M1 are provided on the contact plugs CP1. The contact plugs CP2 are provided on the interconnects M1. The contact plugs CP1 and CP2 are arranged along the Z direction via the interconnects M1. On each of the contact plugs CP2, the pad BP0 or the pad ⁻BP0 arranged above the bit line BL0 is provided.

On the other hand, the pads BP2 and ⁻BP2 are arranged at positions shifted in the X direction from above the corresponding bit lines BL2. More specifically, the contact plugs CP1 are provided on the bit lines BL2 in the 22 direction. The interconnects M1 are provided on the contact plugs CP1. The interconnects M1 coupled to the bit lines BL2 extend in the X direction. The contact plugs CP1 are coupled to one ends of the interconnects M1 in the X direction, and the contact plugs CP2 are coupled to the other ends of the interconnects M1. That is, the contact plugs CP1, the interconnects M1, and the contact plugs CP2 form crank shapes. The pad BP2 or the pad ⁻BP2 is provided on each of the contact plugs CP2. As a result, the pads BP2 and ⁻BP2 are coupled to the bit lines BL2 in a state of being drawn out in the X direction.

For example, a length of a current path coupling the selected bit line BL0 to the pad BP0 via the contact plug CP1, the interconnect M1, and the contact plug CP2 is Lc0. A length of a current path coupling the complementary bit line ⁻BL0 to the pad ⁻BP0 is Ld0. The lengths Lc0 and Ld0 of the current paths have a relationship of Lc0=Ld0. Similarly, a length of a current path coupling the selected bit line BL2 to the pad BP2 is Lc2. Similarly, a length of a current path coupling the selected complementary bit line ⁻BL2 to the pad ⁻BP2 is Ld2. The lengths Lc2 and Ld2 of the current paths have a relationship of Lc2=Ld2. However, the length Lc0 of the current path from the selected bit line BL0 to the pad BP0 is shorter than the length Lc2 of the current path from the selected bit line BL2 to the pad BP2.

2.2 Second Example

Next, a second example of the second embodiment will be described. In the present example, a case where the plurality of sense circuits SA is arranged in parallel in a plurality of rows in the X direction will be described. In this example, each of the sense circuits SA is not arranged between two associated pads BP. That is, the sense circuits SA are not arranged in regions between the sub-arrays 111.

2.2.1 Layout of Bit Lines, Pads BP, and Sense Circuits

An example of a layout of the bit lines BL, the pads BP, and the sense circuits SA will be described with reference to FIG. 18. FIG. 18 is a diagram showing the layout of the sense circuits SA, the pads BP, and the bit lines BL as viewed from the semiconductor substrate SUB side.

As illustrated in FIG. 18, positions where the bit lines BL are divided, and the arrangement of the pads BP are similar to those in FIG. 8 described in the first embodiment. In this state, for example, the sense circuits SA0, SA2, SA8, and SA10 are arranged in two rows in the X direction. Among them, the sense circuits SA0 and SA8 are arranged in a row in the X direction. The sense circuits SA2 and SA10 are arranged in a row in the X direction. More specifically, the sense circuits SA0, SA2, SA8, and SA10 are arranged above the sub-array 111_i+1. That is, the sense circuits SA are not arranged in regions between the sub-arrays 111 in the Y direction. Each sense circuit SA is shifted in the Y direction to one side of the two associated pads BP and ⁻BP. For example, the sense circuit SA0 is shifted from between the pad BP0 and the pad ⁻BP0 to the pad ⁻BP0 side. The same applies to the sense circuit SA8. For example, the sense circuit SA2 is shifted from between the pad BP2 and the pad ⁻BP2 to the pad BP2 side. The same applies to the sense circuit SA10.

Similarly, the sense circuits SA4, SA6, SA12, and SA14 are arranged in two rows in the X direction. Among them, the sense circuits SA4 and SA12 are arranged in a row in the X direction. The sense circuits SA6 and SA14 are arranged in a row in the X direction. The sense circuits SA4, SA6, SA12, and SA14 are arranged above the sub-array 111_i+3. For example, the sense circuit SA4 is shifted from between the pad BP4 and the pad ⁻BP4 to the pad ⁻BP4 side. The same applies to the sense circuit SA12.

2.2.2 Cross-Sectional Configuration of Memory Cell Array

Next, an example of a cross-sectional structure of a memory cell array 110 will be described with reference to FIG. 19. FIG. 19 is a cross-sectional view of a memory device 100. The example in FIG. 19 illustrates the sub-arrays 111_i and 111_i+1 and transistors TN5 and TN6 of the sense circuit SA0. A description will be given focusing on coupling between the pads BP0 and ⁻BP0 and the sense circuit SA0.

As illustrated in FIG. 19, the sense circuit SA0 is arranged below the sub-array 111_i+1. In this case, in a case where each of the pads BP0 and ⁻BP0 is coupled to the sense circuit SA0 such that a length of a current path is the shortest, a length L1 of a current path coupling the pad BP0 to the sense circuit SA0 is longer than a length L2 of a current path coupling the pad ⁻BP0 to the sense circuit SA0. Therefore, in this example, a detour of the current path is formed, and the length L1 and the length L2 are designed to be substantially the same.

For example, each of the sense circuits SA is coupled to the pads BP via contact plugs CPA, interconnects M0, contact plugs CPB, interconnects M1, and contact plugs CPC. The pad BP0 is coupled to the sense circuit SA0 such that the length L1 of the current path becomes the shortest. For example, the contact plug CPA is provided on the transistor TN6 of the sense circuit SA0. The interconnect M0 is provided on the contact plug CPA. The interconnect M0 extends in the Y direction toward the sub-array 111_i. The contact plug CPA is coupled to one end of the interconnect M0. The contact plug CPB is provided on the other end (on the sub-array 111_i side) of the interconnect M0. The interconnect M1 is provided on the contact plug CPB. The contact plug CPC is provided on the interconnect M1. The contact plugs CPB and CPC are arranged along the Z direction. The pad BP0 is provided on the contact plug CPC.

In addition, the pad ⁻BP0 is detoured and coupled to the sense circuit SA0. For example, the contact plug CPA is provided on the transistor TN5 of the sense circuit SA0. The interconnect M0 is provided on the contact plug CPA. The interconnect M0 extends in the Y direction away from the sub-array 111_i. The contact plug CPA is coupled to one end of the interconnect M0. The contact plug CPB is provided on the other end (the side far from the sub-array 111_i) of the interconnect M0. The interconnect M1 is provided on the contact plug CPB. The interconnect M1 extends in the Y direction toward the sub-array 111_i. The contact plug CPB is coupled to one end of the interconnect M1. The contact plug CPC is provided on the other end (side close to the sub-array 111_i) of the interconnect M1. The pad ⁻BP0 is provided on the contact plug CPC.

2.3 Third Example

Next, a third example will be described. In the third example, a case where the arrangement of positions where the bit lines BL are divided is different from that described in the first embodiment will be described.

An example of the layout of the bit lines BL, the pads BP, and the sense circuits SA will be described with reference to FIG. 20. FIG. 20 is a diagram showing the layout of the sense circuits SA, the pads BP, and the bit lines BL as viewed from the semiconductor substrate SUB side.

Hereinafter, in a case where any of the plurality of bit lines BL is indicated, the bit line BL is expressed as a bit line BLj using a variable j (j is an integer of 0 or more). Further, the pad BP coupled to the bit line BLj is referred to as a pad BPj.

As illustrated in FIG. 20, in this example, positions where the plurality of bit lines BL arranged side by side in the X direction are divided are different every two bit lines BL. The arrangement of the positions where the bit lines BL are divided in this example is different from that in FIG. 8 described in the first embodiment. In this example, the pads BPj and BP (j+2) are arranged so as not to be adjacent to each other in the Y direction. For example, the bit lines BL0 to BL1 are divided between the sub-array 111_i and the sub-array 111_i+1. For example, the bit lines BL2 to BL3 are divided between the sub-array 111_i+2 and the sub-array 111_i+3. For example, the bit lines BL4 to BL5 are divided between the sub-array 111_i+1 and the sub-array 111_i+2. That is, in this example, the positions where the bit lines BL2 and BL3 are divided and the positions where the bit lines BL4 and BL5 are divided are switched with respect to FIG. 8 described in the first embodiment.

More specifically, the bit line BL0 coupled to the selected sub-array 111_*i* is electrically coupled to the pad BP0 via the contact plug CP1 above the end of the sub-array 111_*i* facing the sub-array 111_*i*+1. Meanwhile, the bit line BL0 (complementary bit line ⁻BL0) coupled to the unselected sub-arrays 111 (including the sub-arrays 111_*i*+1 to 111_*i*+3) is coupled to the pad ⁻BP0 via the contact plug CP1 above the end of the sub-array 111_*i*+1 facing the sub-array 111_*i*. In the Y direction, the sense circuit SA0 is arranged (intermediate) between the pad BP0 and the pad ⁻BP0. The pads BP0 and ⁻BP0 are coupled to the sense circuit SA0. Similarly to FIG. 8 described in the first embodiment, the pads BP8 and ⁻BP8 coupled to the bit line BL8 and the sense circuit SA8 are arranged adjacent to the pads BP0 and ⁻BP0 and the sense circuit SA0, respectively, in the X direction.

The bit line BL4 coupled to the selected sub-array 111_*i* is electrically coupled to the pad BP4 via the contact plug CP1 above the end of the sub-array 111_*i*+1 facing the sub-array 111_*i*+2. Meanwhile, the bit line BL4 (complementary bit line ⁻BL4) coupled to the unselected sub-arrays 111 (including the sub-arrays 111_*i*+2 to 111_*i*+3) is coupled to the pad ⁻BP4 via the contact plug CP1 above the end of the sub-array 111_*i*+2 facing the sub-array 111_*i*+1. In the Y direction, the sense circuit SA4 is arranged between the pad BP4 and the pad ⁻BP4. The pads BP4 and ⁻BP4 are coupled to the sense circuit SA4. The arrangement of the bit line BL12, the pads BP12 and ⁻BP12, and the sense circuit SA12 is similar to the above-described arrangement. The sense circuit SA4 and the sense circuit SA12 are arranged side by side in the X direction in a region between the sub-array 111_*i*+1 and the sub-array 111_*i*+2.

The bit line BL2 coupled to the selected sub-array 111_*i* is electrically coupled to the pad BP2 via the contact plug CP1 above the end of the sub-array 111_*i*+2 facing the sub-array 111_*i*+3. Meanwhile, the bit line BL2 (complementary bit line ⁻BL2) coupled to the unselected sub-arrays 111 (including the sub-array 111_*i*+3) is coupled to the pad ⁻BP2 via the contact plug CP1 above the end of the sub-array 111_*i*+3 facing the sub-array 111_*i*+2. In the Y direction, the sense circuit SA2 is arranged between the pad BP2 and the pad ⁻BP2. The pads BP2 and ⁻BP2 are coupled to the sense circuit SA2. The arrangement of the bit line BL10, the pads BP10 and ⁻BP10, and the sense circuit SA10 is similar to the above-described arrangement. The sense circuit SA2 and the sense circuit SA10 are arranged side by side in the X direction in a region between the sub-array 111_*i*+2 and the sub-array 111_*i*+3.

2.4 Effects According to Present Embodiment

With the configurations according to the first to third examples of the present embodiment, effects similar to those obtained in the first embodiment can be obtained.

With the configuration according to the first example of the present embodiment, the arrangement of the pads BP and the sense circuits SA can be shifted in the direction (X direction) perpendicular to the longitudinal direction (Y direction) of the associated bit lines BL. The current paths coupling the bit lines BL to the sense circuits SA can be drawn in the direction perpendicular to the longitudinal direction of the bit lines BL. As a result, effects similar to those obtained in the first embodiment can be obtained.

Furthermore, with the configuration according to the first example of the present embodiment, even in a case where the positions where the plurality of bit lines BL are divided are different for every three or more bit lines BL, for example, each of the sense circuits SA can be arranged between two associated pads BP as in the first embodiment.

The first example can also be applied to the first modification example and the second modification example of the first embodiment. In this case, the arrangement of the sense circuits SA can be shifted in the direction (X direction) perpendicular to the longitudinal direction (Y direction) of the associated bit lines BL. Further, the current paths coupling the bit lines BL to the sense circuits SA can be drawn in the direction perpendicular to the longitudinal direction of the bit lines BL.

With the configuration according to the second example of the present embodiment, the plurality of sense circuits SA can be arranged in parallel in a plurality of rows in the X direction. Even in a case where each of the sense circuits SA is not arranged between two associated pads BP, detours can be formed in the current paths between the pads BP and the sense circuits SA. As a result, the lengths L1 and L2 of the current paths coupling the pads BP to the sense circuits SA can be substantially the same. Therefore, effects similar to those obtained in the first modification example and the second modification example of the first embodiment can be obtained.

The second example can also be applied to the second modification example of the first embodiment. In this case, detours can be formed in the current paths coupling the bit lines BL to the sense circuits SA. As a result, the lengths L5 and L6 of the current paths coupling the bit lines BL to the sense circuits SA can be substantially the same. Therefore, effects similar to those obtained in the second modification example of the first embodiment can be obtained.

3. Third Embodiment

Next, a third embodiment will be described. In the third embodiment, a case where positions where bit lines BL are divided are the same will be described. Differences from the first and second embodiments will be mainly described.

3.1 Configuration of Chip

First, an example of a configuration of a chip will be described with reference to FIG. 21. FIG. 21 is a cross-sectional view showing an example of a configuration of a chip of a memory device 100. In the example illustrated in FIG. 21, a memory cell array 110 and sense amplifiers 133 are illustrated in order to simplify the description, and other circuits are omitted.

As illustrated in FIG. 21, the memory cell array 110 includes sub-arrays 111_*i* and 111_*i*+1. Each bit line BL is coupled to a single sub-array 111. That is, the plurality of sub-arrays 111 do not share the bit lines BL. In the example illustrated in FIG. 21, a selected bit line BL coupled to the sub-array 111_*i* and a complementary bit line ⁻BL coupled to the sub-array 111_*i*+1 are illustrated. The lengths of the selected bit line BL and the complementary bit line ⁻BL are substantially the same. For example, in a case where the length of the selected bit line BL illustrated in FIG. 21 is La and the length of the complementary bit line ⁻BL illustrated in FIG. 21 is Lb, there is a relationship of La=Lb.

The plurality of sense amplifiers 133 are dispersedly arranged on the semiconductor substrate SUB of the circuit chip 2000. Each of the sense amplifiers 133 includes a plurality of sense circuits SA arranged in a line in the X direction. In the present embodiment, the sense circuits SA may not be arranged in regions between the sub-arrays 111.

The sense circuit SA is arranged between the pad BP to which the selected bit line BL is coupled and the pad ⁻BP to which the complementary bit line ⁻BL is coupled in the Y direction.

Similarly to the first embodiment, a length of a current path (including a plurality of interconnects and contact plugs) from the pad BP to which the selected bit line BL is coupled to the sense circuit SA is L1. In addition, a length of a current path from the pad ⁻BP to which the complementary bit line ⁻BL is coupled to the sense circuit SA is L2. The length L1 and the length L2 of the current paths are substantially the same.

3.2 Layout of Bit Lines in Memory Cell Array

Next, an example of a layout of the bit lines BL in the memory cell array 110 will be described with reference to FIGS. 22 and 23. FIG. 22 is a diagram showing the layout of the bit lines BL. FIG. 23 is an enlarged view of a region EV2 illustrated in FIG. 22. The example in FIG. 22 illustrates the layout of the bit lines BL as viewed from the semiconductor substrate SUB side. The example in FIG. 23 illustrates a layout of the sense circuits SA, the pads BP, and the bit lines BL as viewed from the semiconductor substrate SUB side.

As illustrated in FIG. 22, the plurality of sub-arrays 111 are arranged side by side in the Y direction. In the example illustrated in FIG. 22, the sub-arrays 111_$i$ and 111_$i$+1 are arranged side by side in order from the upper side of the page of FIG. 22.

The plurality of bit lines BL are arranged side by side in the X direction. The bit lines BL extend in the Y direction. Each of the bit lines BL is divided into bit lines having lengths that are substantially the same in the Y direction. In the present embodiment, positions where the bit lines BL are divided are the same in the Y direction. Each of the divided bit lines BL is coupled to a single sub-array 111.

In the present embodiment, two divided bit lines BL adjacent to each other in the Y direction are coupled to a single sense circuit SA. In the example illustrated in FIG. 22, a word line WL of a sub-array 111_$i$ is selected. Therefore, the divided bit line BL of the sub-array 111_$i$ is the selected bit line BL. The divided bit line BL of the sub-array 111_$i$+1 (or the sub-array 111_$i$−1 (not illustrated)) is the complementary bit line ⁻BL.

For example, two contact plugs CP1 coupled to a single sense circuit SA have different distances from an end of a bit line BL corresponding to the contact plug CP1 to position where the bit line BL and the contact plug CP1 is coupled. In the example illustrated in FIG. 22, the distance from the end of the bit line BL0 of the sub-array 111_$i$ to the position where the bit line BL0 and the contact plug CP1 are coupled is longer than the distance from the end of the bit line BL0 of the sub-array 111_$i$+1 to the position where the bit line BL0 and the contact plug CP1 are coupled. In addition, for example, the distance from the end of the bit line BL6 of the sub-array 111_$i$ to the position where the bit line BL6 and the contact plug CP1 are coupled is shorter than the distance from the end of the bit line BL6 of the sub-array 111_$i$+1 to the position where the bit line BL6 and the contact plug CP1 are coupled.

In addition, the positions where the bit lines BL and the contact plugs CP1 are coupled in the Y direction differ for each bit line BL. For example, while attention is paid to the bit lines BL0, BL2, BL4, and BL6 of the sub-array 111_$i$, the positions where the bit lines BL and the contact plugs CP1 are coupled are located at different positions in the Y direction. However, the distance between two contact plugs CP1 coupled to a single sense circuit SA is substantially the same for each bit line BL.

Next, a description will be given focusing on the positions where the bit lines BL are divided, and the arrangement of the pads BP coupled to the bit lines BL, and the sense circuits SA.

As illustrated in FIG. 23, the pad BP coupled to each bit line BL in each sub-array 111 is arranged above the bit line BL associated with the pad BP. That is, the pads BP are arranged above the corresponding sub-array 111. For example, the pads BP0, BP2, BP4, and BP6 respectively coupled to the bit lines BL0, BL2, BL4, and BL6 of the sub-array 111_$i$ are arranged side by side in the Y direction while being shifted in position in the X direction in accordance with the arrangement of the bit lines BL. In addition, the pads BP8, BP10, BP12, and BP14 respectively coupled to the bit lines BL8, BL10, BL12, and BL14 of the sub-array 111_$i$ are arranged side by side with the pads BP0, BP2, BP4, and BP6, respectively, in the X direction. For example, the distance from the end of the bit line BL0 to the pad BP0, the distance from the end of the bit line BL2 to the pad BP2, the distance from the end of the bit line BL4 to the pad BP4, and the distance from the end of the bit line BL6 to the pad BP6 are different from each other. The same applies to the pads BP8, BP10, BP12, and BP14.

The same applies to the arrangement of the pads BP associated with the sub-array 111_$i$+1. For example, the pads ⁻BP0 and ⁻BP2 respectively coupled to the complementary bit lines ⁻BL0 and ⁻BL2 of the unselected sub-array 111_$i$+1 are arranged side by side in the Y direction while being shifted in position in the X direction in accordance with the arrangement of the bit lines BL. The pads ⁻BP8 and ⁻BP10 respectively coupled to the complementary bit lines ⁻BL8 and ⁻BL10 of the sub-array 111_$i$+1 are arranged side by side with the pads ⁻BP0 an ⁻BP2, respectively, in the X direction. For example, the distance from the end of the bit line ⁻BL0 to the pad ⁻BP0 is different from the distance from the end of the bit line ⁻BL2 to the pad ⁻BP2. The same applies to the pads ⁻BP8 and ⁻BP10.

The distance between the two pads BP coupled to each of the sense circuits SA is substantially the same as the distance between two pads BP coupled to each of the other sense circuits SA, regardless of the bit lines BL. More specifically, for example, the distance between the pad BP0 and the pad ⁻BP0 coupled to the sense circuit SA0 is substantially the same as the distance between the pad BP2 and the pad ⁻BP2 coupled to the sense circuit SA2.

Each of the sense circuits SA is arranged between the two pads BP coupled to the sense circuit SA in the Y direction. More specifically, for example, the sense circuit SA0 is arranged between the pad BP0 and the pad ⁻BP0 in the Y direction. In addition, the sense circuit SA2 is arranged between the pad BP2 and the pad ⁻BP2 in the Y direction. The same applies to the other sense circuits SA. For example, the sense circuit SA8 is arranged between the pad BP8 and the pad ⁻BP8 in the Y direction. The sense circuit SA8 is arranged side by side with the sense circuit SA0 in the X direction. For example, the sense circuit SA10 is arranged between the pad BP10 and the pad ⁻BP10 in the Y direction. The sense circuit SA10 is arranged side by side with the sense circuit SA2 in the X direction.

3.3 Effects According to Present Embodiment

With the configuration according to the present embodiment, each of the sense circuits SA can be arranged between two pads BP coupled to the sense circuit SA. That is, the distance from the sense circuit SA to one of the pads BP coupled to the sense circuit SA and the distance from the sense circuit SA to the other pad BP can be substantially the same. As a result, the length L1 of the current path coupling one of the pads BP to the sense circuit SA and the length L2 of the current path coupling the other pad BP to the sense circuit SA can be substantially the same. Therefore, effects similar to those obtained in the first embodiment can be obtained.

4 Fourth Embodiment

Next, a fourth embodiment will be described. In the fourth embodiment, three examples of the arrangement of pads BP and sense circuits SA different from that described in the third embodiment will be described. Differences from the first to third embodiments will be mainly described.

4.1 First Example

First, a first example of the fourth embodiment will be described. In the present example, a case where pads BP, sense circuits SA, and pads ⁻BP are arranged side by side in the Y direction above each sub-array 111 will be described. FIG. 24 is a diagram showing a layout of the sense circuits SA, the pads BP, and the bit lines BL as viewed from the semiconductor substrate SUB side.

As illustrated in FIG. 24, the arrangement of the bit lines BL is similar to that in FIGS. 22 and 23 described in the third embodiment. The sense circuit SA and the pads BP and ⁻BP coupled to the sense circuits SA are arranged in the Y direction in the order of the pad BP, the sense circuit SA, and the pad ⁻BP above the sub-array 111. That is, each of the sense circuits SA is arranged between the pads BP and ⁻BP associated with the sense circuit SA in the Y direction. Note that, in this example, a detour of a current path can be formed such that a length of a current path between the selected bit line BL and the pad BP and a length of a current path between the complementary bit line ⁻BL and the pad ⁻BP are substantially the same.

The arrangement of the pads BP and ⁻BP and the sense circuits SA illustrated in FIG. 24 is similar to that illustrated in FIG. 20 described in the third example of the second embodiment. That is, the pad BPj and the pad BP (j+2) are arranged so as not to be adjacent to each other in the Y direction. Further, the pad BPj and the pad BP (j+2) are provided above different sub-arrays 111. More specifically, above the sub-array 111_i, the pad BP0 coupled to the bit line BL0 of the selected sub-array 111_i and the pad ⁻BP0 coupled to the complementary bit line ⁻BL0 of the unselected sub-array 111_i+1 are arranged side by side in the Y direction. The sense circuit SA0 is arranged between the pad BP0 and the pad ⁻BP0. In the X direction, the pads BP8 and ⁻BP8 and the sense circuit SA8 are arranged adjacent to the pads BP0 and ⁻BP0 and the sense circuit SA0, respectively.

Above the sub-array 111_i, the pad BP4 coupled to the bit line BL4 of the selected sub-array 111_i and the pad ⁻BP4 coupled to the complementary bit line ⁻BL4 of the unselected sub-array 111_i+1 are arranged side by side in the Y direction. The sense circuit SA4 is arranged between the pad BP4 and the pad ⁻BP4. In the X direction, the pads BP12 and ⁻BP12 and the sense circuit SA12 are arranged adjacent to the pads BP4 and ⁻BP4 and the sense circuit SA4, respectively.

Above the sub-array 111_i+1, the pad BP2 coupled to the bit line BL2 of the selected sub-array 111_i and the pad ⁻BP2 coupled to the complementary bit line ⁻BL2 of the unselected sub-array 111_i+1 are arranged side by side in the Y direction. The sense circuit SA2 is arranged between the pad BP2 and the pad ⁻BP2. In the X direction, the pads BP10 and ⁻BP10 and the sense circuit SA10 are arranged adjacent to the pads BP2 and ⁻BP2 and the sense circuit SA2, respectively.

The arrangement of the pads BP and ⁻BP and the sense circuits SA in this example may be similar to that illustrated in FIG. 8 described in the first embodiment.

4.2 Second Example

Next, a second example of the fourth embodiment will be described. In the present example, a case where pads BP coupled to each of a plurality of bit lines BL selected collectively are not arranged adjacent to each other in the Y direction in a write operation will be described. FIG. 25 is a diagram showing a layout of the pads BP and the bit lines BL.

For example, in the write operation, an operation of writing data in units of 8 bits is performed. In this case, in the write operation, a plurality of memory cells MC coupled to a selected word line WL of a selected sub-array 111 and coupled to each of eight selected bit lines BL are collectively selected. In other words, eight pads BP corresponding to the eight selected bit lines BL are collectively selected.

As illustrated in FIG. 25, in the present example, the plurality of pads BP selected collectively are arranged so as not to be adjacent to each other in the Y direction. For example, in a case where the selected bit lines BL0 to BL7 are collectively selected, the pads BP0 to BP7 are arranged so as not to be adjacent to each other in the Y direction. More specifically, for example, the pads BP0, BP8, BP2, BP10, BP4, BP12, BP6, and BP14 corresponding to the selected sub-array 111_i are arranged side by side in the Y direction. That is, the pads BP0, BP2, BP4, and BP6 are arranged so as not to be adjacent to each other in the Y direction.

4.3 Third Example

Next, a third example of the fourth embodiment will be described. In the present example, a case where the pads BP coupled to each of the plurality of bit lines BL arranged close to each other are not arranged adjacent to each other in the Y direction will be described. FIG. 26 is a diagram showing a layout of the pads BP and the bit lines BL.

As illustrated in FIG. 26, in the present example, the pad BPj, the pad BP (j+2), and the pad BP (j+4) are arranged so as not to be adjacent to each other in the Y direction. The pad BP (j+6) is arranged adjacent to the pad BPj in the Y direction. More specifically, for example, the pads BP0, BP6, BP12, BP18, BP24, and BP30 corresponding to the selected sub-array 111_i are arranged side by side in the Y direction while being shifted in position in the X direction in accordance with the arrangement of the bit lines BL. Similarly, BP2, BP8, BP14, BP20, and BP26 are arranged side by side in the Y direction while being shifted in position in the X direction in accordance with the arrangement of the bit lines BL. The pads BP4 and BP10 are arranged side by side in the Y direction while being shifted in position in the X direction in accordance with the arrangement of the bit lines BL. The pads BP16, BP22, and BP28 are arranged side by side in the Y direction while being shifted in position in the X direction in accordance with the arrangement of the bit lines BL.

4.4 Effects According to Present Embodiment

With the configurations according to the first to third examples of the present embodiment, effects similar to those obtained in the third embodiment can be obtained.

Furthermore, according to the first example of the present embodiment, the pads BPj and BP (j+2) can be arranged so as not to be adjacent to each other in the Y direction. Furthermore, the pad BPj and the pad BP (j+2) can be provided above different sub-arrays 111. As a result, for example, the bit line BL (j+2) can function as a shield of the bit line BLj. As a result, noise of a signal caused by capacitive coupling with the bit lines BL arranged close to each other can be reduced, and a read margin of each of the sense circuits SA can be expanded.

Furthermore, according to the second example of the present embodiment, in the write operation, the plurality of pads BP selected collectively can be arranged so as not to be adjacent to each other in the Y direction. As a result, the parasitic capacitance between the selected pads BP can be reduced.

Furthermore, in the third example of the present embodiment, the pad BPj, the pad BP (j+2), and the pad BP (j+4) can be arranged so as not to be adjacent to each other in the Y direction. As a result, the effect of the parasitic capacitance of the pad BP (j+2) and the pad BP (j+4) on the pad BPj can be reduced.

The arrangement of the pads BP according to the second example and the third example can also be applied to the first embodiment, the first modification example of the first embodiment, and the second modification example of the first embodiment.

5 Fifth Embodiment

Next, a fifth embodiment will be described. In the fifth embodiment, a scheme of sense circuits different from the Open-BL scheme will be described. Differences from the first to fourth embodiments will be mainly described.

5.1 Coupling Between Memory Cell Array 110 and Sense Circuits

First, an example of coupling between a memory cell array 110 and the sense circuits will be described with reference to FIG. 27. FIG. 27 is a schematic diagram showing an example of coupling between the memory cell array 110 and the sense circuits SA. The example in FIG. 27 illustrates sub-arrays 111_i and 111_i+1 and a sense amplifier 133.

As illustrated in FIG. 27, for example, each of the sub-arrays 111_i and 111_i+1 includes a plurality of memory cells MC associated with an even-numbered bit line BL0 and even-numbered word lines WL0, WL2, WL4, and WL6, and a plurality of memory cells MC associated with an odd-numbered bit line BL1 and odd-numbered word lines WL1, WL3, WL5, and WL7. In the present embodiment, an even-numbered bit line BL and an odd-numbered bit line BL that are adjacent to each other in the same sub-array 111 are coupled to a single sense circuit. In the example illustrated in FIG. 27, the bit line BL0 and the bit line BL1 of the sub-array 111_i are coupled to the sense circuit SA0_1. For example, in a case where the word line WL2 of the sub-array 111_i is selected, the bit line BL0 is the selected bit line BL0 and the bit line BL1 is the complementary bit line ⁻BL1.

By using one of the two bit lines BL coupled to the sense circuit SA in the associated sub-array 111 as a reference bit line BL, the sense circuit SA according to the present embodiment can amplify a voltage or a current based on data read from the selected memory cell MC that is coupled to the other bit line BL. Hereinafter, such a scheme is referred to as a Folded-BL scheme.

5.2 Layout of Bit Lines, Pads BP, and Sense Circuits

An example of a layout of bit lines BL, pads BP, and the sense circuits SA will be described with reference to FIG. 28. FIG. 28 is a diagram showing the layout of the sense circuits SA, the pads BP, and the bit lines BL as viewed from the semiconductor substrate SUB side.

As illustrated in FIG. 28, similarly to the third embodiment, positions where the bit lines BL are divided are the same in the Y direction. A single sub-array 111 corresponds to each of the divided bit lines BL.

In the present embodiment, an even-numbered bit line BL and an odd-numbered bit line BL that are arranged adjacent to each other in the X direction are coupled to a single sense circuit SA. In the example illustrated in FIG. 28, the bit line BL0 and the bit line BL1 are coupled to the sense circuit SA0_1. The bit line BL2 and the bit line BL3 are coupled to the sense circuit SA2_3. The bit line BL12 and the bit line BL13 are coupled to the sense circuit SA12_13. The bit line BL14 and the bit line BL15 are coupled to the sense circuit SA 14_15.

The pads BP coupled to each bit line BL are arranged above the associated bit line BL. Each of the pads BP is laid out so as not to be adjacent to the pads BP of the adjacent bit lines BL coupled to the other sense circuits SA in the Y direction. In the example illustrated in FIG. 28, focusing on the bit lines BL0 to BL3, the pads BP1, BP0, BP2, and BP3 are arranged side by side in the Y direction in this order from the upper side of the page of FIG. 28. The order of the pads BP0 and BP1 is changed, and the pads BP1 and BP2 coupled to the different sense circuits are arranged so as not to be arranged side by side in the Y direction. The same applies to the pads BP 12 to BP 15 coupled to the bit lines BL12 to BL15.

Each of the sense circuits SA is arranged between two pads BP associated with the sense circuit SA. In the example illustrated in FIG. 28, the pad BP1, the sense circuit SA0_1, and the pad BP0 are arranged side by side in the Y direction from the upper side to the lower side of the page of FIG. 28. The pad BP2, the sense circuit SA2_3, and the pad BP3 are arranged side by side in the Y direction. The arrangement of the pad BP13, the sense circuit SA12_13, and the pad BP12 is similar to the arrangement of the pad BP1, the sense circuit SA0_1, and the pad BP0. The sense circuit SA0_1 and the sense circuit SA12_13 are arranged side by side in the X direction. The arrangement of the pad BP14, the sense circuit SA 14_15, and the pad BP15 is similar to the arrangement of the pad BP2, the sense circuit SA2_3, and the pad BP3. The sense circuit SA2_3 and the sense circuit SA 14_15 are arranged side by side in the X direction.

5.3 Coupling Between Bit Lines BL and Sense Circuits

Next, coupling between the bit lines BL and the sense circuits SA will be described with reference to FIG. 29. FIG. 29 is a conceptual diagram showing the coupling between the bit lines BL and the sense circuits SA. The example in FIG. 29 illustrates bit lines BL (j−2) to BL (j+3) of a single sub-array 111, pads BP (j−2) to BP (j+3) respectively coupled to the bit lines BL (j−2) to BL (j+3), and three sense circuits SA corresponding to these bit lines BL.

As illustrated in FIG. 29, in the present embodiment, each of the pads BP is laid out so as not to be arranged adjacent to the pads BP of the adjacent bit lines BL coupled to the other sense circuits SA. For example, focusing on the pad BPj, the pad BPj is interchanged with the pad BP (j+1) so as not to be adjacent to the pad BP (j−1). As a result, for example, in a circuit chip 2000, an interconnect (current path) coupling the pad BPj to the sense circuit SA is adjacent to an interconnect (current path) coupling the pad BP (j+2) to the different sense circuit SA. Similarly, an interconnect (current path) coupling the pad BP (j+1) to the sense circuit SA is adjacent to an interconnect (current path) coupling the pad BP (j−1) to the sense circuit SA.

5.4 Effects According to Present Embodiment

With the configuration according to the present embodiment, effects similar to those obtained in the third embodiment can be obtained.

Furthermore, with the configuration according to the present embodiment, the pad BP coupled to a single bit line BL can be laid out so as not to be arranged adjacent to the pad BP of the adjacent bit line BL coupled to the different sense circuit SA in the Y direction. That is, this can reduce the parasitic capacitance between the pads BP coupled to the different sense circuits SA.

In addition, with the configuration according to the present embodiment, the interconnect (current path) coupling the pad BPj to the sense circuit SA can be arranged so as to be adjacent to the interconnect (current path) coupling the pad BP (j+2) to the different sense circuit SA. As a result, in the interconnect coupling the pad BP to the sense circuit SA, it is possible to improve the symmetry of noise caused by the capacitive coupling with the adjacent interconnects. As a result, the asymmetry of noise from the adjacent bit lines BL can be reduced, and the read margin can be improved.

6. Others

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a memory cell array including a first sub-array including a plurality of first memory cells, a second sub-array including a plurality of second memory cells, a third sub-array including a plurality of third memory cells, and a fourth sub-array including a plurality of fourth memory cells;
a first bit line coupled to the first sub-array and the second sub-array and extending in a first direction;
a second bit line arranged side by side with the first bit line in the first direction and coupled to the third sub-array and the fourth sub-array;

34 a third bit line arranged at a position different from the first bit line in a second direction intersecting the first direction and coupled to at least the second sub-array and the third sub-array;
a fourth bit line arranged side by side with the third bit line in the first direction and coupled to the fourth sub-array;
a first circuit electrically coupled to the first bit line and the second bit line; and
a second circuit electrically coupled to the third bit line and the fourth bit line.

2. The memory device according to claim 1, wherein the first circuit is arranged between the second sub-array and the third sub-array in the first direction, and the second circuit is arranged between the third sub-array and the fourth sub-array in the first direction.

3. The memory device according to claim 2, further comprising:
a first chip including the memory cell array; and
a second chip bonded to the first chip and including the first circuit and the second circuit,
wherein the first bit line is electrically coupled to the first circuit via a first pad provided on a bonding surface of the first chip and the second chip, and
the second bit line is electrically coupled to the first circuit via a second pad provided on the bonding surface, and
a length of a first current path coupling the first pad to the first circuit is equal to a length of a second current path coupling the second pad to the first circuit.

4. The memory device according to claim 2, wherein the second sub-array, the first circuit, the third sub-array, the second circuit, and the fourth sub-array are arranged side by side in the first direction on a substrate, and
a length of a third current path coupling the first bit line to the first circuit is equal to a length of a fourth current path coupling the second bit line to the first circuit.

5. The memory device according to claim 2, wherein the first circuit and the second circuit are provided on a substrate,
the first sub-array, the second sub-array, the third sub-array, and the fourth sub-array are arranged above the first circuit and the second circuit in a third direction intersecting the first direction and the second direction and perpendicular to the substrate, and
a length of a fifth current path coupling the first bit line to the first circuit is equal to a length of a sixth current path coupling the second bit line to the first circuit.

6. The memory device according to claim 3, further comprising:
a fifth bit line coupled to the first sub-array and the second sub-array and arranged at a position different from the first bit line in the second direction;
a sixth bit line arranged side by side with the fifth bit line in the first direction and coupled to the third sub-array and the fourth sub-array; and
a third circuit arranged between the second sub-array and the third sub-array in the first direction and electrically coupled to the fifth bit line and the sixth bit line,
wherein the fifth bit line is electrically coupled to the third circuit via a first interconnect extending in the second direction and a third pad provided on the bonding surface and arranged at a position different from the fifth bit line in the second direction, and
the sixth bit line is electrically coupled to the third circuit via a second interconnect extending in the second direction and a fourth pad provided on the bonding surface and arranged at a position different from the sixth bit line in the second direction.

7. The memory device according to claim 3, wherein
the third bit line is electrically coupled to the second circuit via a third pad provided on the bonding surface,
the fourth bit line is electrically coupled to the second circuit via a fourth pad provided on the bonding surface, and
the first pad, the second pad, the first circuit, the second circuit, the third pad, and the fourth pad are arranged side by side in the first direction.

8. The memory device according to claim 1, wherein
each of the plurality of first memory cells includes:
a transistor including a semiconductor layer that has one end coupled to a bit line and in which a channel is formed, and a gate electrode coupled to a word line; and
a capacitor having one electrode coupled to an other end of the semiconductor layer and an other electrode coupled to a plate line.

9. A memory device comprising:
a first chip including:
a memory cell array including a first sub-array including a plurality of first memory cells and a second sub-array including a plurality of second memory cells;
a first bit line coupled to the first sub-array and extending in a first direction; and
a second bit line arranged side by side with the first bit line in the first direction and coupled to the second sub-array, and
a second chip including a first circuit to which the first bit line and the second bit line are electrically coupled, wherein
the first bit line is electrically coupled to the first circuit via a first pad provided on a bonding surface of the first chip and the second chip,
the second bit line is electrically coupled to the first circuit via a second pad provided on the bonding surface, and
the first circuit is arranged between the first pad and the second pad in the first direction.

10. The memory device according to claim 9, wherein
a length of a first current path coupling the first pad to the first circuit is equal to a length of a second current path coupling the second pad to the first circuit.

11. The memory device according to claim 9, wherein
the first pad, the first circuit, and the second pad are arranged side by side in the first direction above the first sub-array.

12. The memory device according to claim 11, wherein
the first chip further includes:
a third bit line arranged side by side with the first bit line in a second direction intersecting the first direction;
a fourth bit line arranged side by side with the second bit line in the second direction; and
a second circuit to which the third bit line and the fourth bit line are electrically coupled,
the third bit line is electrically coupled to the second circuit via a third pad provided on the bonding surface,
the fourth bit line is electrically coupled to the second circuit via a fourth pad provided on the bonding surface, and
the third pad, the second circuit, and the fourth pad are arranged side by side in the first direction above the second sub-array.

13. The memory device according to claim 9, wherein
the first chip further includes a jth (j is an integer of 0 or more) bit line, a (j+1) th bit line, and a (j+2) th bit line that are coupled to the first sub-array,
the jth bit line is coupled to a jth pad on the bonding surface,
the (j+1) th bit line is coupled to a (j+1) th pad on the bonding surface,
the (j+2) th bit line is coupled to a (j+2) th pad on the bonding surface, and
the jth pad and the (j+2) th pad are not adjacent to each other in the first direction.

14. The memory device according to claim 13, wherein
the jth bit line and the (j+2) th bit line are collectively selected in a write operation.

15. The memory device according to claim 9, wherein
each of the plurality of first memory cells includes:
a transistor including a semiconductor layer that has one end coupled to a bit line and in which a channel is formed, and a gate electrode coupled to a word line; and
a capacitor having one electrode coupled to an other end of the semiconductor layer and an other electrode coupled to a plate line.

16. A memory device comprising:
a first chip including:
a memory cell array including a first sub-array including a plurality of first memory cells;
a first bit line coupled to the first sub-array and extending in a first direction;
a second bit line arranged side by side with the first bit line in a second direction intersecting the first direction;
a third bit line arranged side by side with the second bit line in the second direction; and
a fourth bit line arranged side by side with the third bit line in the second direction, and
a second chip including:
a first circuit to which the first bit line and the second bit line are electrically coupled; and
a second circuit to which the third bit line and the fourth bit line are electrically coupled,
wherein the first bit line is electrically coupled to the first circuit via a first pad provided on a bonding surface of the first chip and the second chip, and
the second bit line is electrically coupled to the first circuit via a second pad provided on the bonding surface,
the third bit line is electrically coupled to the second circuit via a third pad provided on the bonding surface,
the fourth bit line is electrically coupled to the second circuit via a fourth pad provided on the bonding surface,
the first pad, the first circuit, and the second pad are arranged side by side in the first direction,
the third pad, the second circuit, and the fourth pad are arranged side by side in the first direction, and
the second pad and the third pad are not adjacent to each other in the first direction.

17. The memory device according to claim 16, wherein
a length of a first current path coupling the first pad to the first circuit is equal to a length of a second current path coupling the second pad to the first circuit.

18. The memory device according to claim 16, wherein
each of the plurality of first memory cells includes:
a transistor including a semiconductor layer that has one end coupled to a bit line and in which a channel is formed, and a gate electrode coupled to a word line; and a capacitor having one electrode coupled to an other end of the semiconductor layer and an other electrode coupled to a plate line.

<center>* * * * *</center>